US011150753B2

(12) United States Patent
Lee et al.

(10) Patent No.: US 11,150,753 B2
(45) Date of Patent: Oct. 19, 2021

(54) DISPLAY DEVICE INCLUDING A TOUCH DETECTING UNIT HAVING AN INSULATING PATTERN

(71) Applicant: SAMSUNG DISPLAY CO., LTD., Yongin-si (KR)

(72) Inventors: Sun Hee Lee, Hwaseong-si (KR); Sun Ho Kim, Seongnam-si (KR); Hyun Jun Kim, Seoul (KR); Ju Chan Park, Seoul (KR); Hyun Kim, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/837,468

(22) Filed: Apr. 1, 2020

(65) Prior Publication Data
US 2020/0401246 A1    Dec. 24, 2020

(30) Foreign Application Priority Data
Jun. 20, 2019    (KR) .......................... 10-2019-0073224

(51) Int. Cl.
*G06F 3/041*    (2006.01)

(52) U.S. Cl.
CPC .................................... *G06F 3/041* (2013.01)

(58) Field of Classification Search
CPC ....... G06F 3/041; G06F 3/0412; G06F 3/0446
USPC ................................................. 345/173, 174
See application file for complete search history.

(56) References Cited

U.S. PATENT DOCUMENTS

| | | | |
|---|---|---|---|
| 9,130,181 B2* | 9/2015 | Choi | G06F 3/0412 |
| 10,319,308 B2* | 6/2019 | Lee | H01L 51/0097 |
| 2017/0256654 A1* | 9/2017 | Yamazaki | G02F 1/13439 |
| 2018/0348937 A1* | 12/2018 | Pak | G06F 3/0446 |
| 2019/0035935 A1* | 1/2019 | Nakazawa | H01L 27/1207 |

FOREIGN PATENT DOCUMENTS

CN          109786394          5/2019

* cited by examiner

*Primary Examiner* — Calvin C Ma
(74) *Attorney, Agent, or Firm* — F. Chau & Associates, LLC

(57) ABSTRACT

A display device includes a pixel including a first electrode, an emission layer, and a second electrode, a buffer layer disposed on the pixel, a first insulating pattern disposed on the buffer layer, and a second insulating pattern disposed on the first insulating pattern and having an island shape. The pixel, the buffer layer, the first insulating pattern, and the second insulating pattern are disposed in a thickness direction, and the second insulating pattern overlaps the pixel in the thickness direction.

21 Claims, 19 Drawing Sheets

US 11,150,753 B2

DISPLAY DEVICE INCLUDING A TOUCH DETECTING UNIT HAVING AN INSULATING PATTERN

CROSS-REFERENCE TO RELATED APPLICATION

This application claims priority under 35 U.S.C. § 119 to Korean Patent Application No. 10-2019-0073224, filed on Jun. 20, 2019 in the Korean Intellectual Property Office, the disclosure of which is incorporated by reference herein in its entirety.

TECHNICAL FIELD

Exemplary embodiments of the inventive concept relate to a display device including a touch detecting unit having an insulating pattern.

DISCUSSION OF RELATED ART

Electronic devices that display images to a user such as a smart phone, a tablet personal computer (PC), a digital camera, a laptop computer, a navigation device, or a television (TV) include a display device for displaying images. Such a display device includes a display panel for generating and displaying an image and various input means.

Recently, a flexible display device having a portion that can be bent or folded has been developed, in which a bottom substrate and a top substrate of a display panel thereof are made of a flexible material. Moreover, as the thickness of display devices is ever reduced, there is ongoing research to improve the impact resistance of the display devices.

SUMMARY

According to an exemplary embodiment of the inventive concept, a display device includes a pixel including a first electrode, an emission layer, and a second electrode, a buffer layer disposed on the pixel, a first insulating pattern disposed on the buffer layer, and a second insulating pattern disposed on the first insulating pattern and having an island shape. The pixel, the buffer layer, the first insulating pattern, and the second insulating pattern are disposed in a thickness direction, and the second insulating pattern overlaps the pixel in the thickness direction.

The display device may further include a first insulating layer disposed between the first insulating pattern and the second insulating pattern, and touch electrodes disposed on the first insulating layer and located on a same layer as the second insulating pattern.

The touch electrodes may include mesh holes, and the first insulating pattern may overlap the touch electrodes in the thickness direction.

The second insulating pattern may be located in the mesh holes.

The first insulating pattern and the second insulating pattern may not overlap each other in the thickness direction.

The second insulating pattern may include a plurality of second insulating patterns spaced apart from one another, and a distance between adjacent second insulating patterns among the plurality of second insulating patterns may be greater than a width of one of the touch electrodes.

The display device may further include a second insulating layer covering the touch electrodes and the second insulating pattern. The first insulating layer and the second insulating layer may include an organic material, and the first insulating pattern and the second insulating pattern may include an inorganic material.

The display device may further include a third insulating pattern disposed between the pixel and the second insulating pattern. The third insulating pattern may overlap the pixel and the second insulating pattern in the thickness direction.

The display device may further include a fourth insulating pattern disposed on the second insulating layer, and the fourth insulating pattern may overlap the touch electrodes in the thickness direction.

The fourth insulating pattern may overlap a portion of the second insulating pattern in the thickness direction, and the fourth insulating pattern may not overlap the pixel in the thickness direction.

The display device may further include a third insulating layer covering the fourth insulating pattern and the second insulating layer. The third insulating layer may include an organic material, and the third insulating pattern and the fourth insulating pattern may include an inorganic material.

A thickness of the second insulating pattern may be greater than a thickness of the touch electrodes.

The second insulating pattern may cover a portion of the touch electrodes.

The second insulating pattern may be spaced apart from the touch electrodes.

According to an exemplary embodiment of the inventive concept, a display device includes a pixel including a first electrode, an emission layer, and a second electrode, a buffer layer disposed on the pixel, a first insulating pattern disposed on the buffer layer and having an island shape, and a second insulating pattern disposed on the first insulating pattern and having an island shape. The pixel, the buffer layer, the first insulating pattern, and the second insulating pattern are disposed in a thickness direction. The first insulating pattern and the second insulating layer pattern do not overlap the pixel in the thickness direction.

The display device may further include touch electrodes disposed between the first insulating pattern and the second insulating pattern. The first insulating pattern and the second insulating pattern may overlap the touch electrodes in the thickness direction.

The first insulating pattern and the second insulating pattern may not overlap each other in the thickness direction.

The second insulating pattern may cover a side surface of one of the touch electrodes.

The display device may further include a first insulating layer disposed between the first insulating pattern and the touch electrodes, and a second insulating layer covering the touch electrodes and the second insulating pattern.

The first insulating layer and the second insulating layer may include an organic material, and the first insulating pattern and the second insulating pattern may include an inorganic material.

According to an exemplary embodiment of the inventive concept, a display device includes a pixel including a first electrode, an emission layer, and a second electrode, a buffer layer disposed on the pixel, a plurality of touch electrodes disposed on the buffer layer, a plurality of first insulating patterns disposed on the buffer layer, a first insulating layer covering the plurality of touch electrodes and the plurality of first insulating patterns, and a plurality of second insulating patterns disposed on the first insulating layer. The pixel, the buffer layer, the plurality of touch electrodes, the plurality of first insulating patterns, the first insulating layer, and the plurality of second insulating patterns are disposed in a thickness direction. Each of the plurality of touch electrodes overlaps and contacts one of the plurality of first insulating patterns in the thickness direction.

BRIEF DESCRIPTION OF THE DRAWINGS

The above and other aspects and features of the inventive concept will become more apparent by describing in detail exemplary embodiments thereof with reference to the attached drawings.

DETAILED DESCRIPTION OF THE EMBODIMENTS

Figure 1:
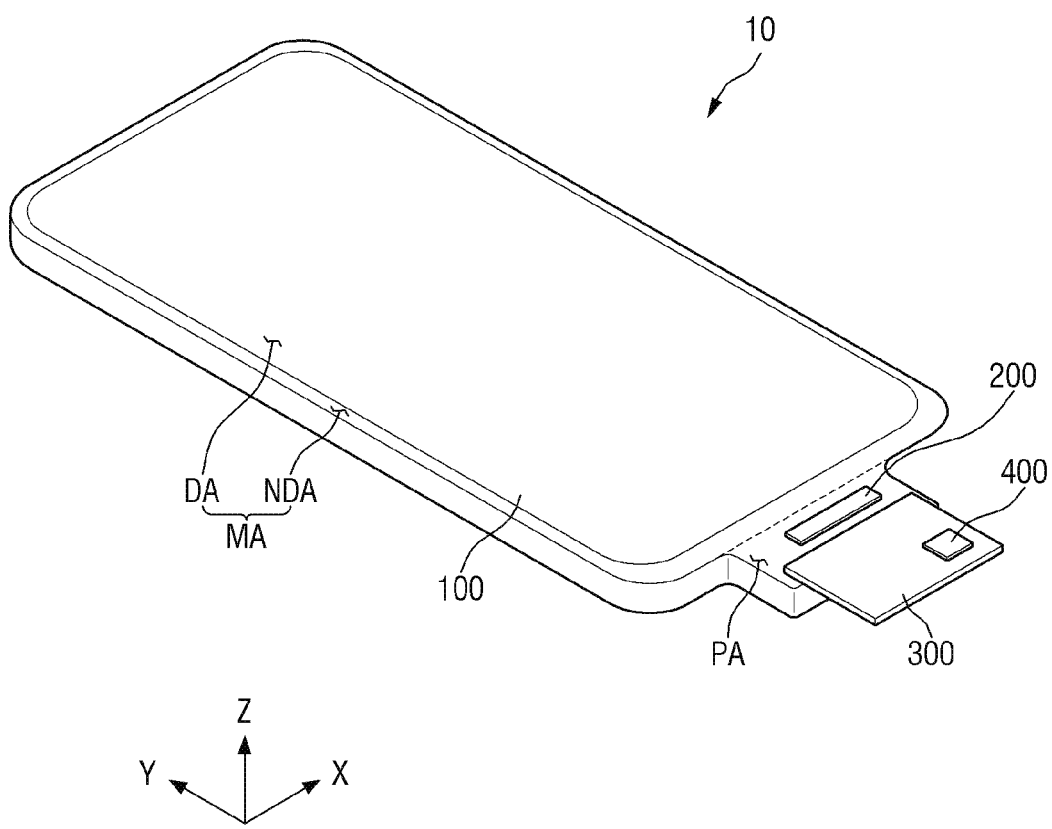
FIG. 1 is a perspective view of a display device according to an exemplary embodiment of the inventive concept.

Exemplary embodiments of the inventive concept provide a display device with improved impact resistance.

According to exemplary embodiments of the inventive concept, impact resistance of a display device can be effectively improved by disposing an insulating pattern in a touch detecting unit. Accordingly, it is possible to prevent damage and deformation of a display panel in a thin display device due to external impact.

Exemplary embodiments of the inventive concept will be described more fully hereinafter with reference to the accompanying drawings. Like reference numerals may refer to like elements throughout this application.

In the attached drawings, the thickness of layers and regions is exaggerated for clarity. It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the inventive concept.

Figure 2:
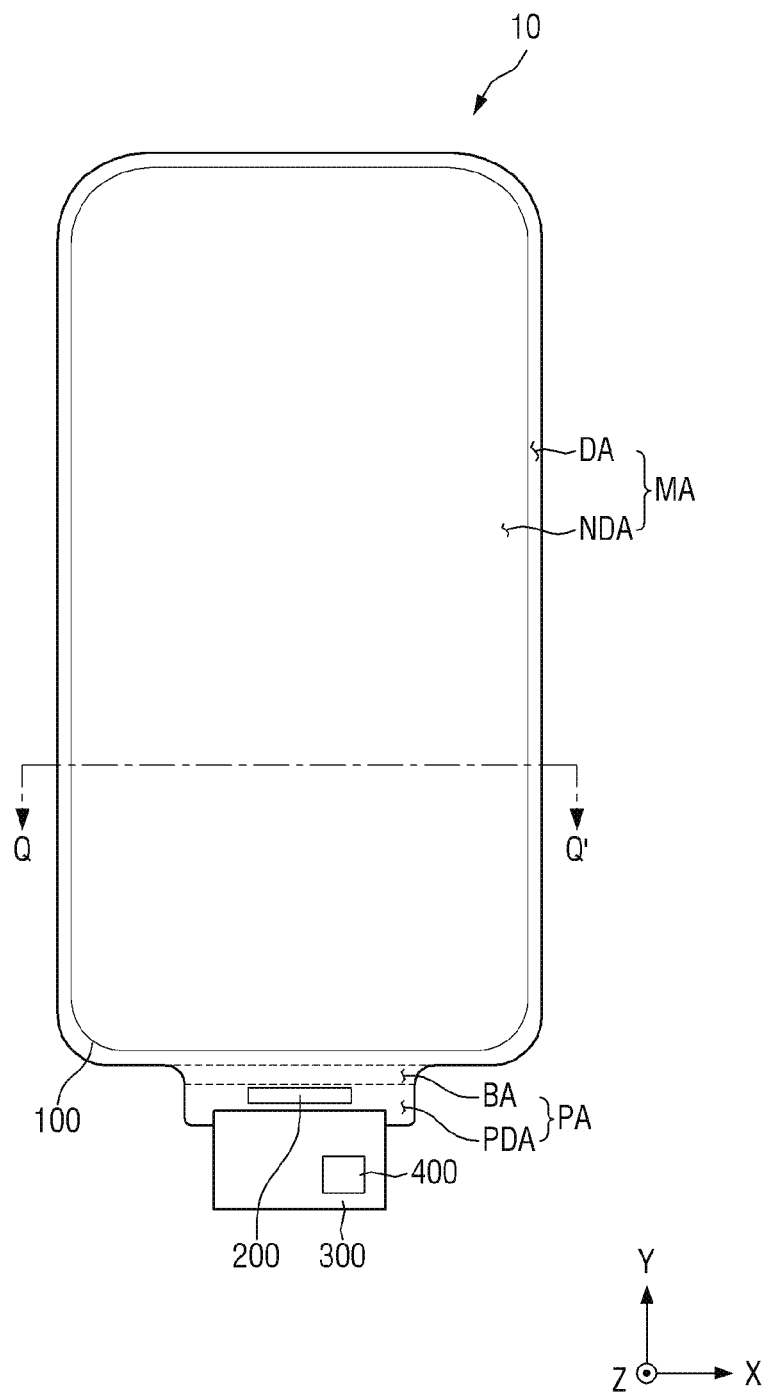
FIG. 2 is a plan view of a display device according to an exemplary embodiment of the inventive concept.

FIG. 1 is a perspective view of a display device according to an exemplary embodiment of the inventive concept. FIG. 2 is a plan view of a display device according to an exemplary embodiment of the inventive concept.

As used herein, the terms "above," "top," and "upper surface" refer to the upper side of a display panel 100, e.g., the side indicated by the arrow in the z-axis direction, whereas the terms "below," "bottom," and "lower surface" refer to the lower side of the display panel 100, e.g., the opposite side in the z-axis direction. As used herein, the terms "left," "right," "upper," and "lower" sides indicate relative positions when the display panel 100 is viewed from the top. For example, the "left side" refers to the opposite direction indicated by the arrow of the x-axis, the "right side" refers to the direction indicated by the arrow of the x-axis, the "upper side" refers to the direction indicated by the arrow of the y-axis, and the "lower side" refers to the opposite direction indicated by the arrow of the y-axis.

Referring to FIGS. 1 to 2, a display device 10 is for displaying moving images or still images. The display device 10 may be used as the display screen of portable electronic devices such as a mobile phone, a smart phone, a tablet personal computer (PC), a smart watch, a watch phone, a mobile communications terminal, an electronic notebook, an electronic book, a portable multimedia player (PMP), a navigation device, or an ultra mobile PC (UMPC), as well as the display screen of various products such as a television, a notebook, a monitor, a billboard, or an Internet of Things device. The display device 10 may be one of an organic light-emitting display device, a liquid-crystal display device, a plasma display device, a field emission display device, an electrophoretic display device, an electrowetting display device, a quantum dot light-emitting display device, a micro LED display device, or the like. In the following description, an organic light-emitting display device is described as an example of the display device 10. It is, however, to be understood that the inventive concept is not limited thereto.

According to an exemplary embodiment of the inventive concept, the display device 10 includes the display panel 100, a display driving circuit 200, a circuit board 300, and a touch driving circuit 400.

The display panel 100 may include a main area MA and a protruding area PA protruding from one side of the main area MA.

The main area MA may be formed in a rectangular plane having shorter sides in a first direction (x-axis direction) and longer sides in a second direction (y-axis direction) intersecting the first direction (x-axis direction). Each of the corners where the short side in the first direction (x-axis direction) meets the longer side in the second direction (y-axis direction) may be rounded with a predetermined curvature or may be a right angle. The shape of the display device 10 when viewed from the top is not limited to a quadrangular shape, but may be formed in another polygonal shape, circular shape, or elliptical shape. The main area MA may be formed to be flat, but is not limited thereto. The main area MA may include curved portions formed at left and right ends thereof. The curved portions may have a constant curvature or varying curvatures.

The main area MA may include a display area DA where pixels are formed to display images, and a non-display area NDA around the display area DA.

In addition to the pixels, scan lines, data lines, and power lines connected to the pixels may be disposed in the display area DA. When the main area MA includes a curved portion, the display area DA may be disposed on the curved portion. In such a case, the image of the display panel 100 can also be seen on the curved portion. In exemplary embodiments of the inventive concept, curved portions may be formed on all four sides surrounding the main area MA, in which case images can be seen from all the four sides as well as the front side (e.g., the upper surface).

The non-display area NDA may refer to the area from the outer side of the display area DA to the edge of the display panel 100. In the non-display area NDA, a scan driver for applying scan signals to the scan lines, and link lines connecting the data lines with the display driving circuit 200 may be disposed.

The protruding area PA may protrude from one side of the main area MA. For example, the protruding area PA may protrude from the lower side of the main area MA as shown in FIG. 2. The length of the protruding area PA in the first direction (x-axis direction) may be smaller than the length of the main area MA in the first direction (x-axis direction).

The protruding area PA may include a bending area BA and a pad area PDA. In such a case, the pad area PDA may be disposed on one side of the bending area BA, and the main area MA may be disposed on the opposite side of the bending area BA. For example, the pad area PDA may be disposed on the lower side of the bending area BA, and the main area MA may be disposed on the upper side of the bending area BA.

The display panel 100 may be formed to be flexible so that it can be curved, bent, folded, or rolled. Therefore, the display panel 100 may be bent at the bending area BA in a thickness direction. In such a case, the surface of the pad area PDA of the display panel 100 faces upward before the display panel 100 is bent, while the surface of the pad area PDA of the display panel 100 faces downward after the display panel 100 is bent. As a result, since the pad area PDA is disposed under the main area MA, it may overlap the main area MA.

Pads electrically connected to the display driving circuit 200 and the circuit board 300 may be disposed in the pad area PDA of the display panel 100.

The display driving circuit 200 outputs signals and voltages for driving the display panel 100. For example, the display driving circuit 200 may apply data voltages to the data lines. In addition, the display driving circuit 200 may apply supply voltage to the power lines and may apply scan control signals to the scan driver. The display driving circuit 200 may be implemented as an integrated circuit (IC) and may be attached to the display panel 100 in the pad area PDA by a chip on glass (COG) technique, a chip on plastic (COP) technique, or an ultrasonic bonding technique. For example, the display driving circuit 200 may be mounted on the circuit board 300.

The pads may include display pads electrically connected to the display driving circuit 200 and touch pads electrically connected to touch lines.

The circuit board 300 may be attached to the pads using an anisotropic conductive film. In this manner, lead lines of the circuit board 300 may be electrically connected to the pads. The circuit board 300 may be a flexible printed circuit board, a printed circuit board, or a flexible film such as a chip on film.

The touch driving circuit 400 may be connected to the touch electrodes of a touch detecting unit TDU of the display panel 100. The touch driving circuit 400 applies driving signals to the touch electrodes of the touch detecting unit TDU and measures capacitances of the touch electrodes. The driving signals may have driving pulses. The touch driving circuit 400 may not only determine whether a touch is input based on the capacitances, but also calculate touch coordinates of the position where the touch is input.

The touch driving circuit 400 may be disposed on the circuit board 300. The touch driving circuit 400 may be implemented as an integrated circuit (IC) and may be mounted on the circuit board 300.

Figure 3:
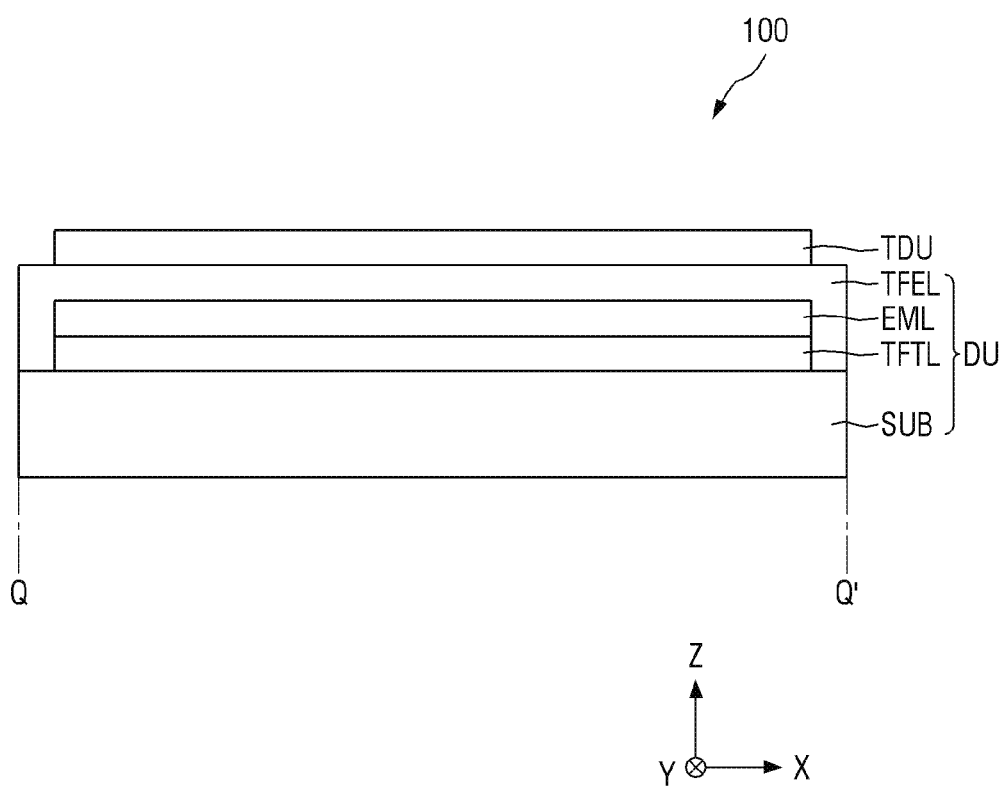
FIG. 3 is a cross-sectional view of a display panel of FIG. 2, taken along line Q-Q' according to an exemplary embodiment of the inventive concept

FIG. 3 is a cross-sectional view of a display panel of FIG. 2, taken along line Q-Q' according to an exemplary embodiment of the inventive concept.

Referring to FIG. 3, the display panel 100 may include a display unit DU having a substrate SUB, a thin-film transistor layer TFTL disposed on the substrate SUB, an emission material layer EML, and a thin-film encapsulation layer TFEL. The display panel 100 may further include the touch detecting unit TDU disposed on the display unit DU.

The substrate SUB may be made of an insulating material such as glass, quartz, or a polymer resin. Examples of the polymer resin may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. Alternatively, the substrate SUB may include a metallic material.

The substrate SUB may be a rigid substrate or a flexible substrate that can be bent, folded, rolled, and so on. When the substrate SUB is a flexible substrate, it may be formed of, but is not limited to, polyimide (PI).

Figure 4:
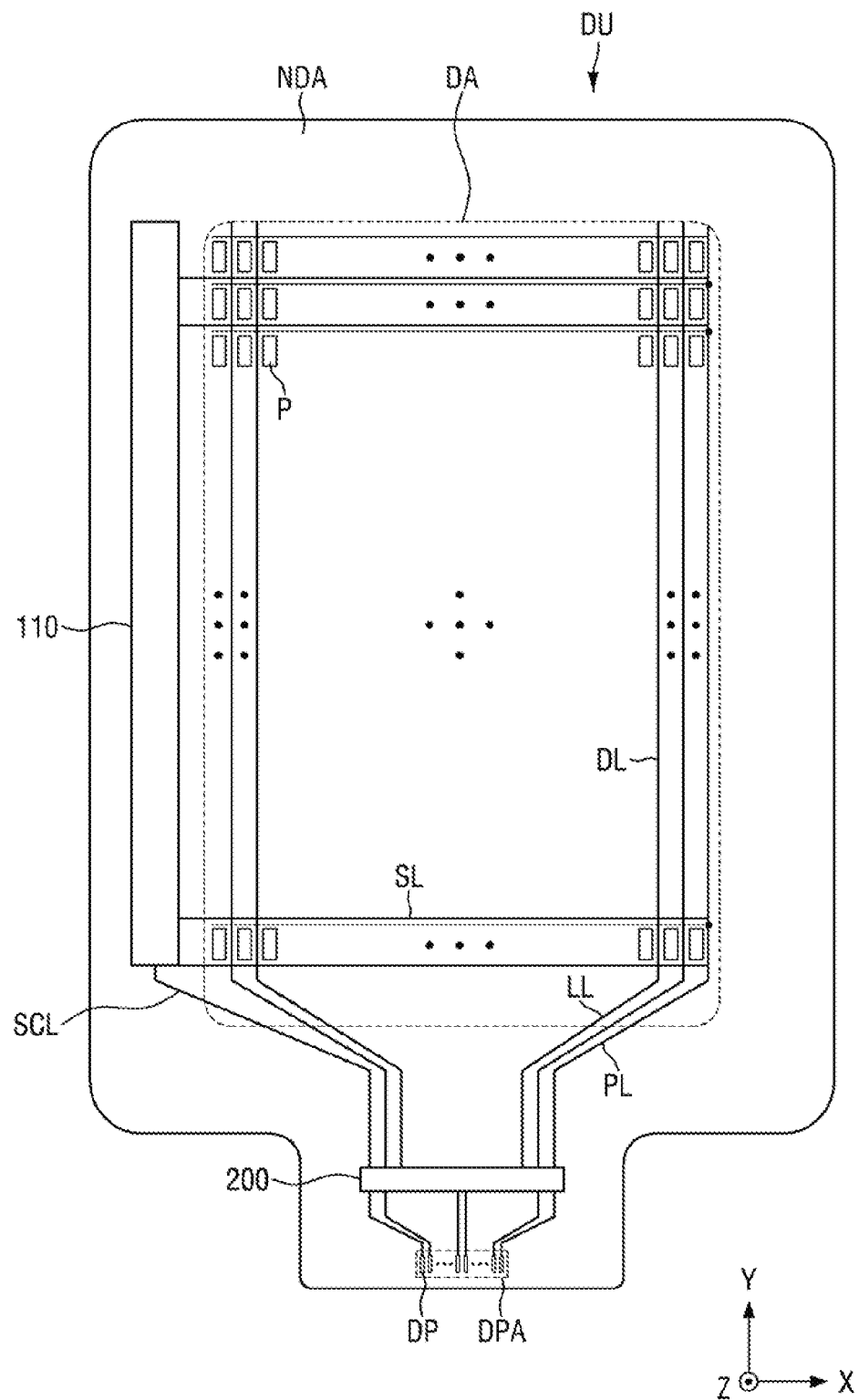
FIG. 4 is a view showing a display unit of FIG. 3 in detail according to an exemplary embodiment of the inventive concept.

The thin-film transistor layer TFTL may be disposed on the substrate SUB. On the thin-film transistor layer TFTL, scan lines, data lines, power supply lines, scan control lines, and link lines connecting the pads with the data lines may be formed as well as thin-film transistors in the pixels. Each of the thin-film transistors may include a gate electrode, a semiconductor layer, a source electrode, and a drain electrode. When a scan driver 110 is formed in the non-display area NDA of the display panel 100 as shown in FIG. 4, the scan driver 110 may include thin-film transistors.

The thin-film transistor layer TFTL may be disposed in the display area DA and the non-display area NDA. For example, the thin-film transistors in the pixels, the scan lines, the data lines, and the power supply lines on the thin-film transistor layer TFTL may be disposed in the display area DA. The scan control lines and the link lines on the thin-film transistor layer TFTL may be disposed in the non-display area NDA.

The emission material layer EML may be disposed on the thin-film transistor layer TFTL. The emission material layer EML may include pixels including a first electrode, an emission layer, and a second electrode, as well as a bank. The emission layer may be an organic emission layer containing an organic material. The emission layer may include a hole transporting layer, an organic light-emitting layer, and an electron transporting layer. When a voltage is applied to the first electrode and a cathode voltage is applied to the second electrode through the thin-film transistor on the thin-film transistor layer TFTL, the holes and electrons move to the organic light-emitting layer through the hole transporting layer and the electron transporting layer, respectively, such that they combine in the organic light-emitting layer to emit light. The pixels on the emission material layer EML may be disposed in the display area DA.

The thin-film encapsulation layer TFEL may be disposed on the emission material layer EML. The thin-film encapsulation layer TFEL serves to prevent oxygen or moisture from permeating into the emission material layer EML. To this end, the thin-film encapsulation layer TFEL may include at least one inorganic layer. The inorganic layer may be, but is not limited to, a silicon nitride layer, a silicon oxynitride layer, a silicon oxide layer, a titanium oxide layer, or an aluminum oxide layer. In addition, the thin-film encapsulation layer TFEL protects the emission material layer EML from foreign substances such as dust. To this end, the thin-film encapsulation layer TFEL may include at least one organic layer. The organic layer may be formed of, but is not limited to, an acryl resin, an epoxy resin, a phenolic resin, a polyamide resin, or a polyimide resin.

The thin-film encapsulation layer TFEL may be disposed in the display area DA as well as the non-display area NDA. For example, the thin-film encapsulation layer TFEL may cover the display area DA and the emission material layer EML, and may cover the thin-film transistor layer TFTL in the non-display area NDA.

The touch detecting unit TDU may be disposed on the thin-film encapsulation layer TFEL. As the touch detecting unit TDU is disposed directly on the thin-film encapsulation layer TFEL, the thickness of the display device 10 can be reduced, as compared to a display device in which a separate touch panel including a touch detecting unit is attached on a thin-film encapsulation layer.

The touch detecting unit TDU may include touch electrodes for detecting a user's touch by capacitive sensing, and touch lines for connecting the pads with the touch electrodes. For example, the touch detecting unit TDU can detect a user's touch by self-capacitance sensing or mutual capacitance sensing.

Figure 5:
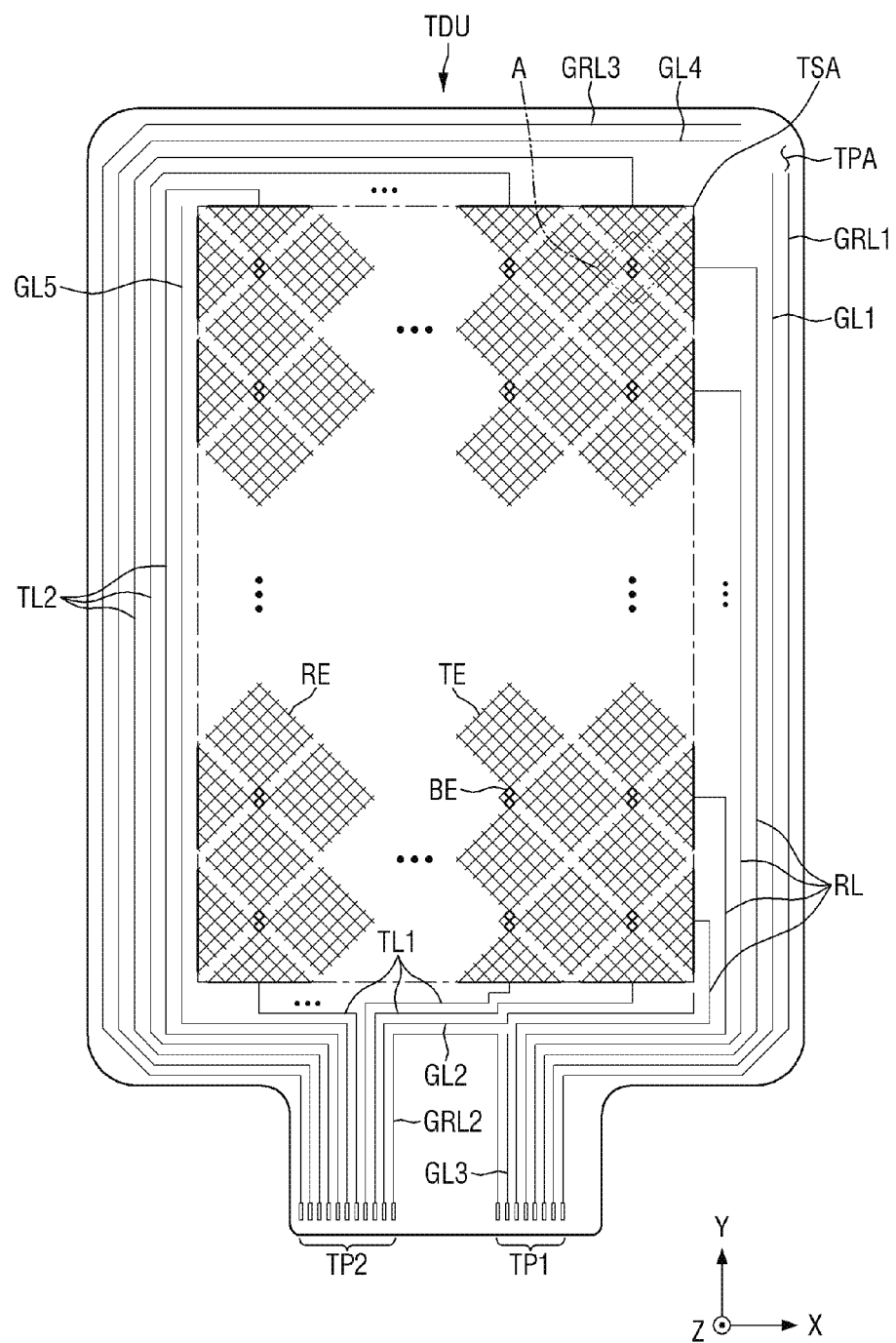
FIG. 5 is a view showing a touch detecting unit of FIG. 3 in detail according to an exemplary embodiment of the inventive concept.

The touch electrodes of the touch detecting unit TDU may be disposed in a touch sensor area TSA overlapping the display area DA as shown in FIG. 5. The touch lines of the touch detecting unit TDU may be disposed in a touch peripheral area TPA overlapping the non-display area NDA as shown in FIG. 5.

A cover window may be further disposed on the touch detecting unit TDU, in which case the touch detecting unit TDU and the cover window may be attached together by a transparent adhesive member such as an optically clear adhesive (OCA) film.

FIG. 4 is a view showing a display unit of FIG. 3 in detail according to an exemplary embodiment of the inventive concept.

For convenience of illustration, FIG. 4 shows only pixels P, scan lines SL, data lines DL, a power line PL, scan control lines SCL, link lines LL, the scan driver 110, the display driving circuit 200, and display pads DP of the display unit DU. The display pads may be disposed in a display pad area DPA.

Referring to FIG. 4, the scan lines SL, the data lines DL, the power line PL, and the pixels P are disposed within the display area DA. The scan lines SL may be arranged in the first direction (x-axis direction), while the data lines DL may be arranged in the second direction (y-axis direction) intersecting the first direction (x-axis direction). The power line PL may include at least one line substantially in parallel with the data lines DL in the second direction (y-axis direction) and a plurality of lines branching off from the at least one line in the first direction (x-axis direction).

Each of the pixels P may be connected to at least one of the scan lines SL, one of the data lines DL, and the power line PL. Each of the pixels P may include thin-film transistors including a driving transistor and at least one switching transistor, an organic light-emitting diode, and a capacitor. When a scan signal is applied from the scans line SL, each of the pixels P receives a data voltage of a corresponding one of the data lines DL and supplies a driving current to the organic light-emitting diode according to the data voltage applied to a gate electrode, so that light is emitted.

The scan driver 110 is connected to the display driving circuit 200 through at least one scan control line SCL. Accordingly, the scan driver 110 may receive the scan control signal of the display driving circuit 200. The scan driver 110 generates scan signals according to the scan control signal and supplies the scan signals to the scan lines SL.

Although the scan driver 110 is formed in the non-display area NDA on the left side of the display area DA in FIG. 4, the inventive concept is not limited thereto. For example, the scan driver 110 may be formed in the non-display area NDA on the left side as well as in the non-display area NDA on the right side of the display area DA.

The display driving circuit 200 is connected to the display pads DP and receives digital video data and timing signals. The display driving circuit 200 converts the digital video data into analog positive/negative data voltages and supplies them to the data lines DL through the link lines LL. In addition, the display driving circuit 200 generates and supplies the scan control signal for controlling the scan driver 110 through the scan control lines SCL. The pixels P to which the data voltages are supplied are selected by the scan signals of the scan driver 110, and the data voltages are supplied to the selected pixels P. The display driving circuit 200 may be implemented as an integrated circuit (IC) and may be attached to the substrate SUB by a chip on glass (COG) technique, a chip on plastic (COP) technique, or an ultrasonic bonding technique.

FIG. 5 is a view showing a touch detecting unit of FIG. 3 in detail according to an exemplary embodiment of the inventive concept. For convenience of illustration, FIG. 5 shows only touch electrodes TE and RE, touch lines TL and RL, and touch pads TP.

Referring to FIG. 5, the touch detecting unit TDU includes the touch sensor area TSA for detecting a user's touch, and a touch peripheral area TPA disposed around the touch sensor area TSA. The touch sensor area TSA may overlap the display area DA of the display panel 100, and the touch peripheral area TPA may overlap the non-display area NDA of the display panel 100.

The touch electrodes TE and RE may be disposed in the touch sensor area TSA. The touch electrodes TE and RE may include sensing electrodes RE electrically connected with one another in the first direction (x-axis direction), and driving electrodes TE electrically connected with one another in the second direction (y-axis direction) intersecting the first direction (x-axis direction). In addition, although the sensing electrodes RE and the driving electrodes TE are formed in a diamond-like shape when viewed from the top in FIG. 5, the inventive concept is not limited thereto.

To prevent a short-circuit from being created between the sensing electrodes RE and the driving electrodes TE as they cross one another, the driving electrodes TE adjacent to each other in the second direction (y-axis direction) may be electrically connected to each other via a connection electrode BE. In such a case, the driving electrodes TE and the sensing electrodes RE may be disposed on one layer, while the connection electrode BE may be disposed on a different layer from the driving electrodes TE and the sensing electrodes RE. In addition, the sensing electrodes RE electrically connected with one another in the first direction (x-axis direction), and the driving electrodes TE electrically connected with one another in the second direction (y-axis direction) are electrically insulated from one another.

The touch lines TL and RL may be disposed in the touch peripheral area TPA. The touch lines TL and RL may include sensing lines RL connected to the sensing electrodes RE, and first driving lines TL1 and second driving lines TL2 connected to the driving electrodes TE.

The sensing electrodes RE disposed on the right side of the touch sensor area TSA may be connected to the sensing lines RL. For example, some of the sensing electrodes RE electrically connected in the first direction (x-axis direction) that are disposed at the right end may be connected to the sensing lines RL. The sensing lines RL may be connected to first touch pads TP1 of the touch pads TP. Thus, the touch driving circuit 400 may be electrically connected to the sensing electrodes RE.

In exemplary embodiments of the inventive concept, the driving electrodes TE disposed on the lower side of the touch area TSA may be connected to the first driving lines TL1, while the driving electrodes TE disposed on the upper side of the touch area TSA may be connected to the second driving lines TL2. For example, some of the driving electrodes TE electrically connected to one another in the second direction (y-axis direction) on the lowermost side may be connected to the first driving line TL1, while some of the driving electrodes TE disposed on the uppermost side may be connected to the second driving line TL2. The second driving lines TL2 may be connected to the driving electrodes TE on the upper side of the touch sensor area TSA via the left outer side of the touch sensor area TSA. The first driving lines TL1 and the second driving lines TL2 may be connected to second touch pads TP2 of the touch pads TP. Thus, the touch driving circuit 400 may be electrically connected to the driving electrodes TE.

The touch electrodes TE and RE may be driven in a self-capacitance sensing scheme or a mutual-capacitance sensing scheme. When the touch electrodes TE and RE are driven in the mutual-capacitance sensing scheme, the driving signals are supplied to the driving electrodes TE through the first driving lines TL1 and the second driving lines TL2, such that mutual capacitances formed at the intersections between the sensing electrodes RE and the driving electrodes TE are charged. Then, changes in the amount of the charges of the sensing electrodes RE are measured through the sensing lines RL, and it is determined whether a touch input is made according to the changes in the amount of the charges of the sensing electrodes RE. The driving signals may have driving pulses.

When the touch electrodes TE and RE are driven in the self-capacitance sensing scheme, the driving signals are supplied to the driving electrodes TE as well as the sensing electrodes RE through the first driving lines TL1, the second driving lines TL2, and the sensing lines RL. By doing so, the self capacitances of the driving electrodes TE and the sensing electrodes RE are charged. Then, changes in the amount of the charges of the self-capacitances of the driving electrodes TE and the sensing electrodes RE are measured through the first driving lines TL1, the second driving lines TL2, and the sensing lines RL, and it is determined whether a touch input is made based on the changes in the amount of the charges of the self-capacitances.

The driving electrodes TE, the sensing electrodes RE, and the connection electrodes BE may be formed as mesh-shaped electrodes as shown in FIG. 5. If the touch detecting unit TDU including the driving electrodes TE and the sensing electrodes RE is formed directly on the thin-film encapsulation layer TFEL as shown in FIG. 3, the distance between the second electrode of the emission material layer EML and the driving electrodes TE or the sensing electrodes RE of the touch sensing layer TSP is close. As a result, a very large parasitic capacitance may be formed between the second electrode of the emission material layer EML and the driving electrodes TE or the sensing electrodes RE of the touch sensing layer TSL. For this reason, to reduce the parasitic capacitance, the driving electrodes TE and the sensing electrodes RE may be formed as the mesh-shaped pattern as shown in FIG. 5, rather than being formed as non-patterned electrodes of a transparent oxide conductive layer such as ITO and IZO.

In exemplary embodiments of the inventive concept, a first guard line GL1 may be disposed on the outer side of the outermost one of the sensing lines RL. In addition, a first ground line GRL1 may be disposed on the outer side of the first guard line GL1. In other words, the first guard line GL1 may be disposed on the right side of the rightmost one of the sensing lines RL, and the first ground line GRL1 may be disposed on the right side of the first guard line GL1.

In exemplary embodiments of the inventive concept, a second guard line GL2 may be disposed between the innermost one of the sensing lines RL and the first driving line TL1 which is the rightmost one of the first driving lines TL1. The second guard line GL2 may be disposed between the rightmost one of the first driving lines TL1 and a second ground line GRL2. Furthermore, a third guard line GL3 may be disposed between the innermost one of the sensing lines RL and the second ground line GRL2. The second ground line GRL2 may be connected to the leftmost one of the first touch pads TP1 and the rightmost one of the second touch pads TP2.

In exemplary embodiments of the inventive concept, a fourth guard line GL4 may be disposed on the outer side of the outermost one of the second driving lines TL2. In addition, a third ground line GRL3 may be disposed on the outer side of the fourth guard line GL4. For example, the fourth guard line GL4 may be disposed on the left and upper sides of the leftmost and the uppermost one of the second driving lines TL2. The third ground line GRL3 may be disposed on the left and the upper sides of the fourth guard line GL4.

In exemplary embodiments of the inventive concept, a fifth guard line GL5 may be disposed on the inner side of the innermost one of the second driving lines TL2. For example, the fifth guard line GL5 may be disposed between the rightmost one of the second driving lines TL2 and the touch electrodes TE and RE.

According to the exemplary embodiment shown in FIG. 5, the first ground line GRL1, the second ground line GRL2, and the third ground line GRL3 are disposed on the uppermost side, the leftmost side, and the rightmost side of the display panel 100, respectively. In addition, a ground voltage is applied to the first ground line GRL1, the second ground line GRL2, and the third ground line GRL3. Accordingly, when static electricity is applied from the outside, the static electricity can be discharged to the first ground line GRL1, the second ground line GRL2, and the third ground line GRL3.

In addition, according to the exemplary embodiment shown in FIG. 5, the first guard line GL1 is disposed between the outermost one of the sensing lines RL and the first ground line GRL1, so that it can reduce the influence from a change in the voltage of the first ground line GRL1 on the outermost one of the sensing lines RL. The second guard line GL2 is disposed between the innermost one of the sensing lines RL and the outermost one of the first driving lines TL1. Therefore, the second guard line GL2 can reduce the influence from a change in the voltage of the innermost one of the sensing lines RL on the outermost one of the first driving lines TL1. The third guard line GL3 is disposed between the innermost one of the sensing lines RL and the second ground line GRL2, so that it can reduce the influence from a change in the voltage of the second ground line GRL2 on the innermost one of the sensing lines RL. The fourth guard line GL4 is disposed between the outermost one of the second sensing lines TL2 and the third ground line GRL3, so that it can reduce the influence from a change in the voltage of the third ground line GRL3 on the second driving line TL2. The fifth guard line GL5 is disposed between the innermost one of the second driving lines TL2 and the touch electrodes TE and RE, so that it can reduce mutual influence between the innermost one of the second driving lines TL2 and the touch electrodes TE and RE.

When the touch electrodes TE and RE are driven by the mutual-capacitance sensing scheme, a ground voltage may be applied to the first guard line GL1, the second guard line GL2, the third guard line GL3, the fourth guard line GL4, and the fifth line GL5. When the touch electrodes TE and RE are driven by the self-capacitance sensing scheme, the same driving signals as the driving signals applied to the first driving lines TL1, the second driving lines TL2, and the sensing lines RL may be applied to the first guard line GL1, the second guard line GL2, the third guard line GL3, the fourth guard line GL4, and the fifth guard line GL5. However, it is to be noted that the configuration and arrangement of the lines TL1, TL2, RL, GL1, GL2, GL3, GL4, GL5, GRL1, GRL2, and GRL3 of the touch detecting unit TDU shown in FIG. 5 are merely examples.

Figure 6:
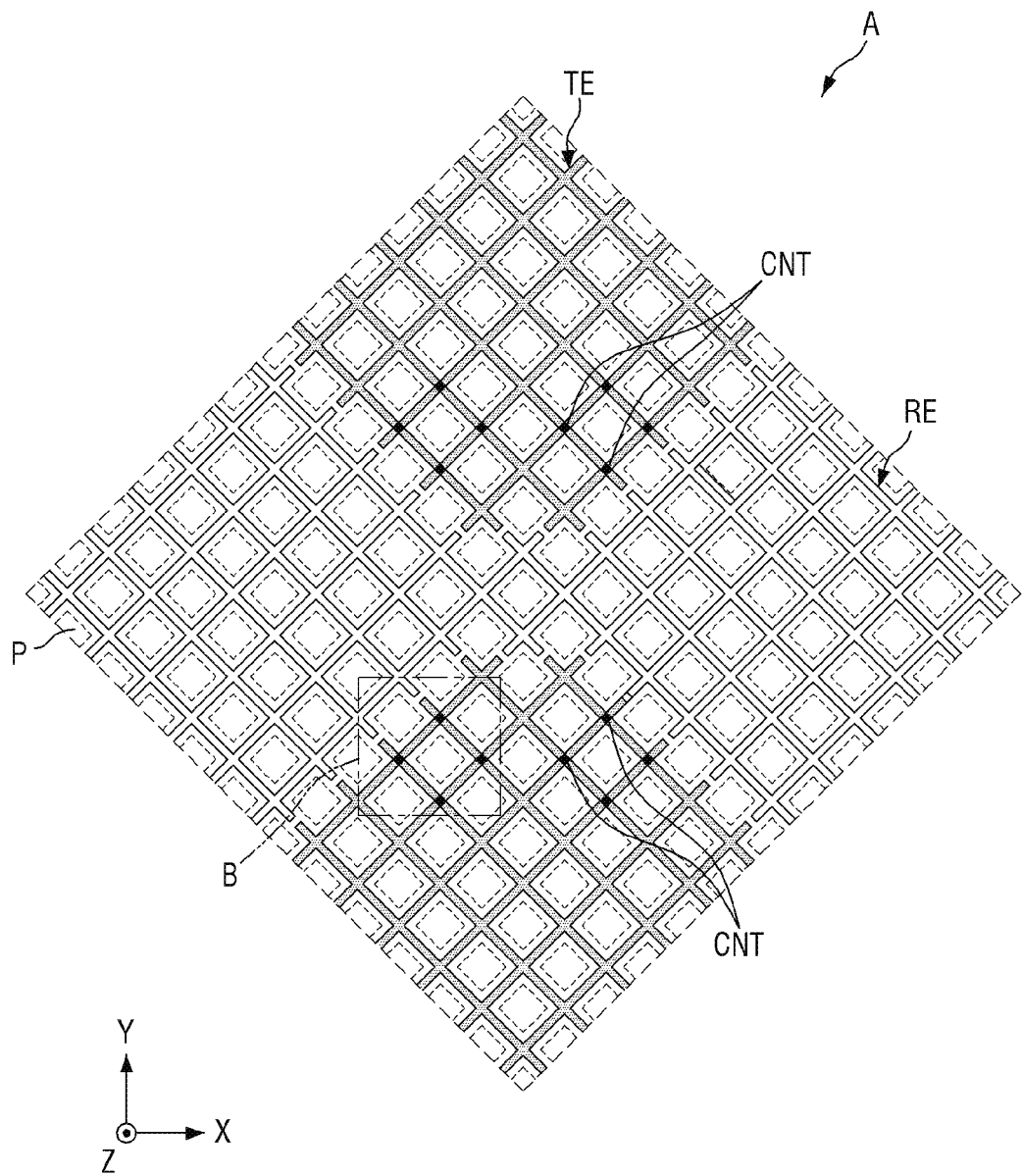
FIG. 6 is an enlarged view of a portion A of the touch detecting unit of FIG. 5, for illustrating an arrangement relationship between electrodes of the touch detecting unit and pixels of the display unit according to an exemplary embodiment of the inventive concept.

FIG. 6 is an enlarged view of a portion A of the touch detecting unit of FIG. 5, for illustrating an arrangement relationship between electrodes of the touch detecting unit and pixels of the display unit according to an exemplary embodiment of the inventive concept.

Referring to FIG. 6, the driving electrodes TE and the sensing electrodes RE of the touch detecting unit TDU may be in the form of a mesh as shown in FIG. 6.

In exemplary embodiments of the inventive concept, each of the driving electrodes TE and the sensing electrodes RE included in the touch detecting unit TDU may be in the form of a mesh surrounding the pixels P. Each of the pixels P may be defined as a region in which light generated in the emission material layer EML of the display unit DU exits to the outside of the display unit DU. In exemplary embodiments of the inventive concept, each of the pixels P may represent one of first to third colors. The first color may be red, the second color may be green, and the third color may be blue. It is, however, to be understood that the inventive concept is not limited thereto. In exemplary embodiments of the inventive concept, the pixels P may represent the same first color or may represent first to fourth colors.

Although the pixels P are formed in a diamond shape when viewed from the top in the example shown in FIG. 6, the inventive concept is not limited thereto. In other words, the pixels P may be formed in a rectangular or square shape when viewed from the top or may be formed in any other polygonal shape, a circular shape, or an elliptic shape other than a quadrangular shape. Further, the shapes of the pixels P may be different from one another.

Although the pixels P have the same size when viewed from the top in the example shown in FIG. 6, the inventive concept is not limited thereto. In exemplary embodiments of the inventive concept, the pixels P may have different sizes when viewed from the top. For example, when viewed from the top, the size of the pixels P producing red light may be larger than the size of the pixels P producing green light, and the size of the pixels P producing blue light may be larger than the size of the pixels P producing the green light. Further, in exemplary embodiments of the inventive concept, the size of the pixels P producing red light may be substantially equal to or smaller than the size of the pixels P producing blue light when viewed from the top.

The connection electrodes BE shown in FIG. 5 may electrically connect the driving electrodes TE with one another in the second direction (y-axis direction). For example, the connection electrode BE may be disposed under the driving electrodes TE and may electrically connect the driving electrodes TE in the second direction (y-axis direction) through contact holes CNT.

As shown in FIG. 6, adjacent ones of the sensing electrodes RE are electrically connected to each other in the first direction (x-axis direction).

In exemplary embodiments of the inventive concept, the driving electrodes TE and the sensing electrodes RE may be disposed on one layer, while the connection electrodes BE may be disposed on a different layer from the driving electrodes TE and the sensing electrodes RE. In addition, the sensing electrodes RE electrically connected with one another in the first direction (x-axis direction), and the driving electrodes TE electrically connected with one another in the second direction (y-axis direction) are electrically insulated from one another. The connection electrodes BE may be connected to the driving electrodes TE through the contact holes CNT, where they overlap with the driving electrodes TE.

Figure 7:
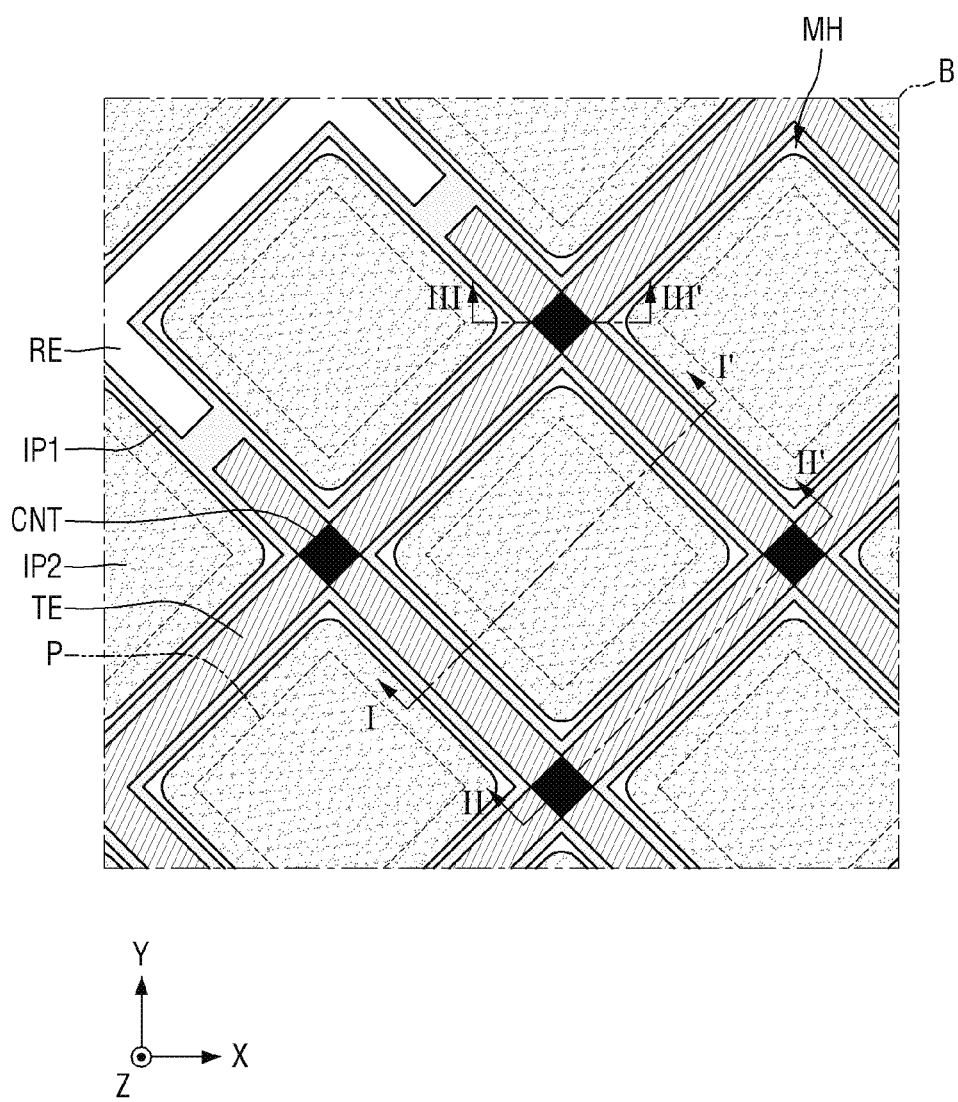
FIG. 7 is an enlarged view of a portion B of the portion A of FIG. 6, for illustrating an arrangement relationship between electrodes of the touch detecting unit, pixels of the display unit, and an insulating pattern according to an exemplary embodiment of the inventive concept.
Figure 8:
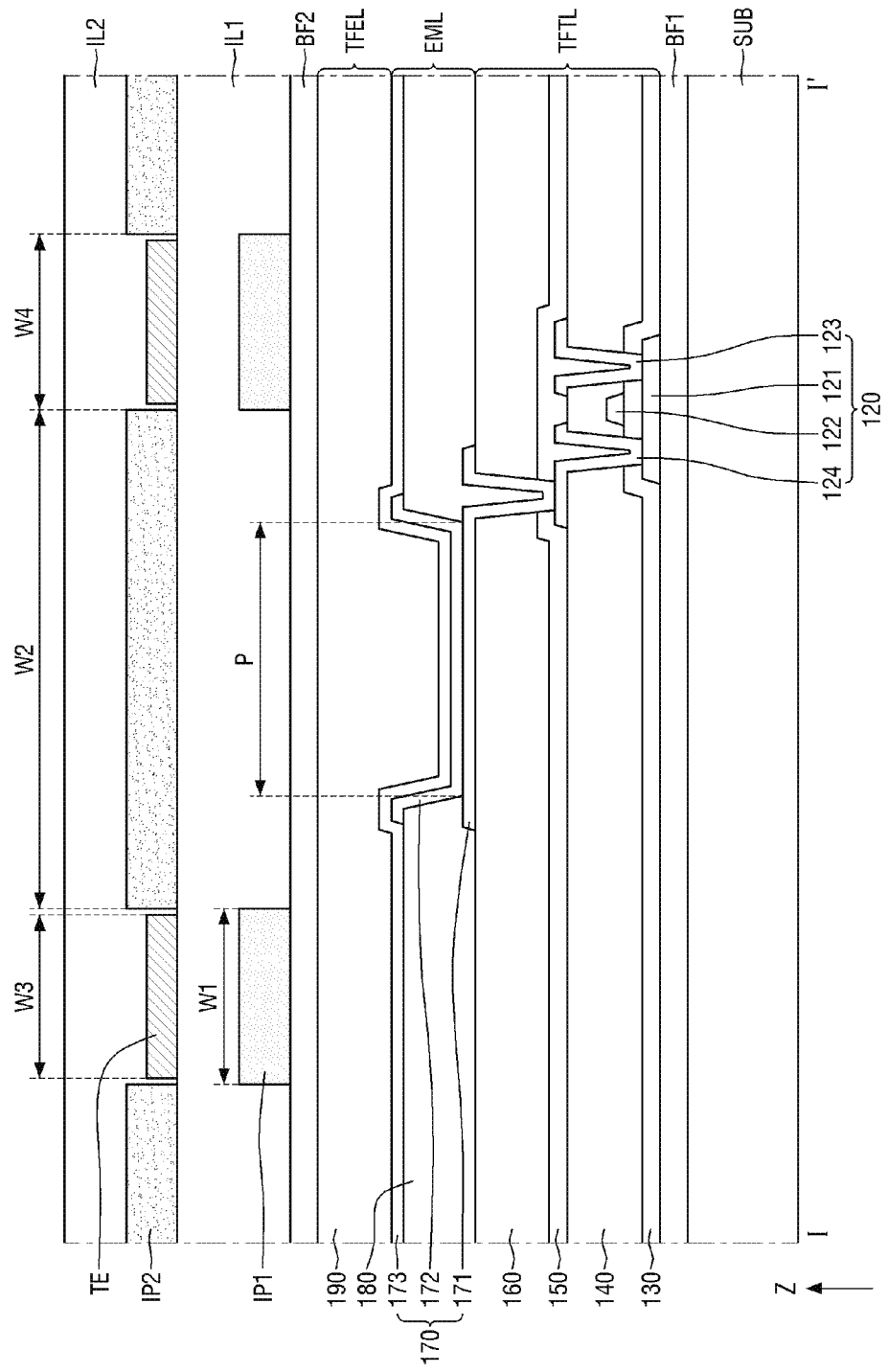
FIG. 8 is a cross-sectional view taken along line I-I' of FIG. 7 according to an exemplary embodiment of the inventive concept.
Figure 9:
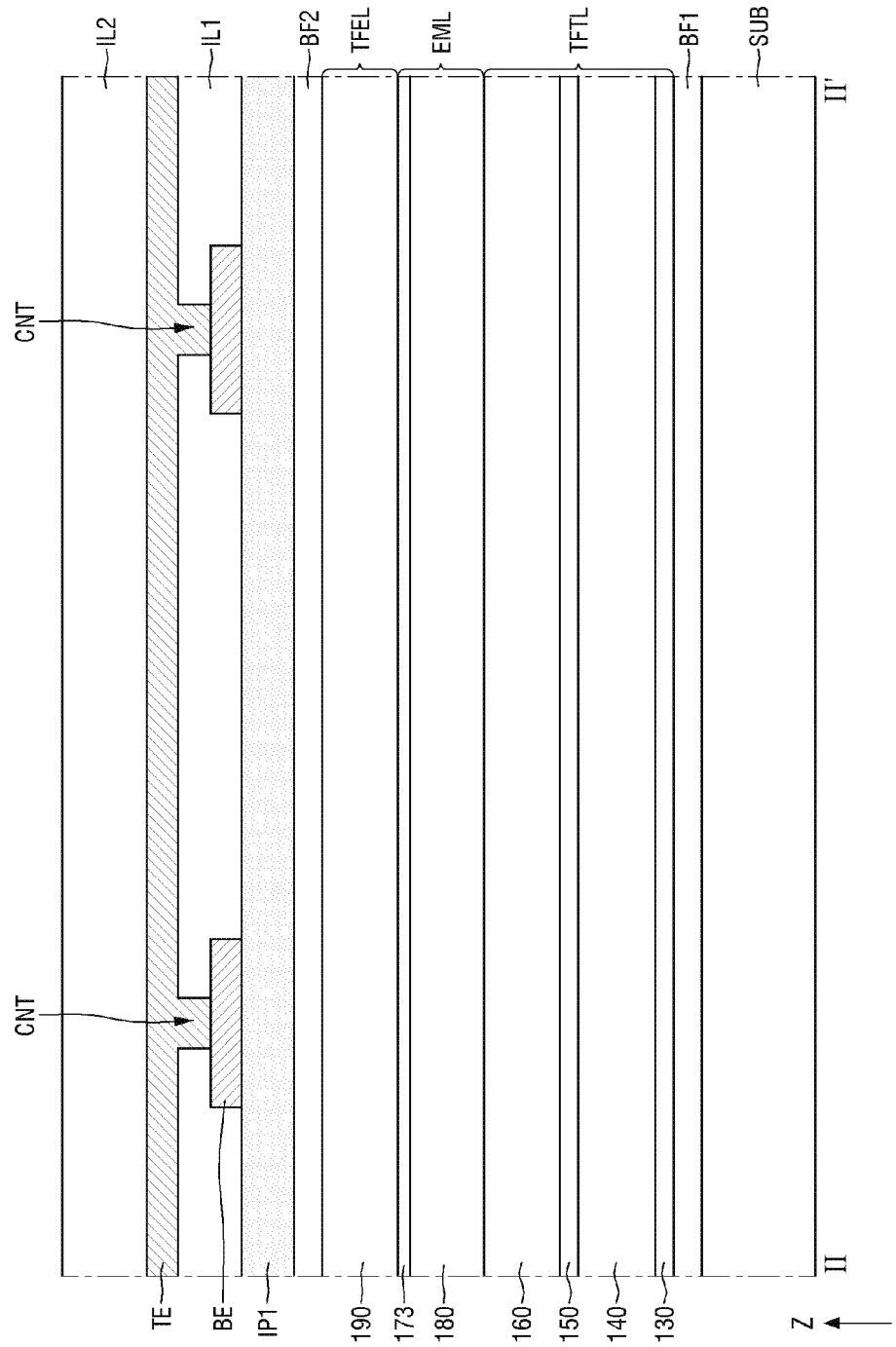
FIG. 9 is a cross-sectional view taken along line II-II' of FIG. 7 according to an exemplary embodiment of the inventive concept.
Figure 10:
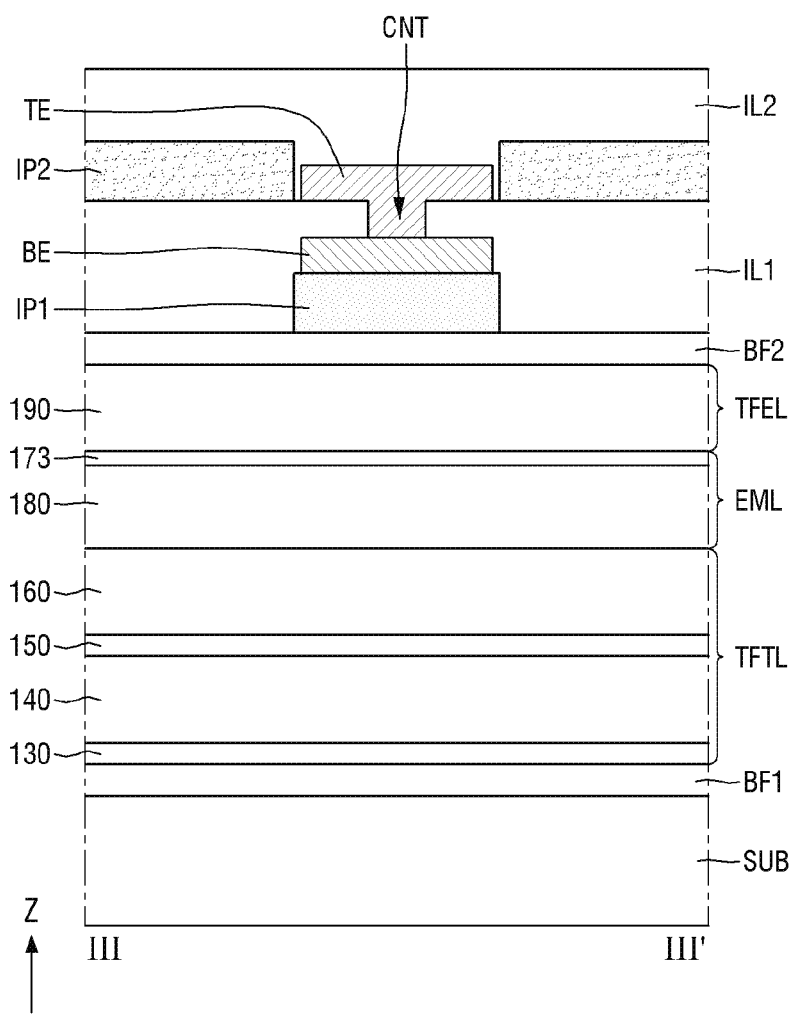
FIG. 10 is a cross-sectional view taken along line III-III' of FIG. 7 according to an exemplary embodiment of the inventive concept.

FIG. 7 is an enlarged view of a portion B of the portion A of FIG. 6, for illustrating an arrangement relationship between electrodes of the touch detecting unit, pixels of the display unit, and an insulating pattern according to an exemplary embodiment of the inventive concept. FIG. 8 is a cross-sectional view taken along line I-I' of FIG. 7 according to an exemplary embodiment of the inventive concept. FIG. 9 is a cross-sectional view taken along line II-II' of FIG. 7 according to an exemplary embodiment of the inventive concept. FIG. 10 is a cross-sectional view taken along line III-III' of FIG. 7 according to an exemplary embodiment of the inventive concept.

Referring to FIGS. 7 to 10, the thin-film transistor layer TFTL is formed on the substrate SUB. The thin-film transistor layer TFTL includes thin-film transistors 120, a gate insulating layer 130, an interlayer dielectric layer 140, a protective layer 150, and a planarization layer 160.

A first buffer layer BF1 may be formed on one surface of the substrate SUB. The first buffer layer BF1 may be formed on one surface of the substrate SUB to protect the thin-film transistors 120 and an organic emitting layer 172 of the emission material layer EML from moisture that is likely to permeate through the substrate SUB. The first buffer layer BF1 may be made up of multiple inorganic layers sequentially stacked on one another. For example, the first buffer layer BF1 may be made up of multiple layers in which one or more inorganic layers of a silicon nitride layer, a silicon oxynitride layer, a silicon oxide layer, a titanium oxide layer, and an aluminum oxide layer are alternately stacked on one another. In an exemplary embodiment of the inventive concept, the first buffer layer BF1 may be eliminated.

The thin-film transistors 120 are formed on the first buffer layer BF1. Each of the thin-film transistors 120 includes an active layer 121, a gate electrode 122, a source electrode 123, and a drain electrode 124. In FIG. 8, the thin-film transistors 120 are implemented as top-gate transistors in which the gate electrode 122 is located above the active layer 121. It is, however, to be understood that the inventive concept is not limited thereto. In other words, the thin-film transistors 120 may be implemented as bottom-gate transistors in which the gate electrode 122 is located below the active layer 121, or as double-gate transistors in which the gate electrodes 122 are disposed above and below the active layer 121.

The active layer 121 is formed on the first buffer layer BF1. The active layer 121 may include polycrystalline silicon, single crystal silicon, low-temperature polycrystalline silicon, amorphous silicon, or an oxide semiconductor. The oxide semiconductor may include, for example, a binary compound (ABx), a ternary compound (ABxCy), or a quaternary compound (ABxCyDz) containing indium, zinc, gallium, tin, titanium, aluminum, hafnium (Hf), zirconium (Zr), magnesium (Mg), etc. For example, the active layer 121 may include an Indium Tin Zinc Oxide (ITZO) or an Indium Gallium Zinc Oxide (IGZO). A light-blocking layer for blocking external light incident on the active layer 121 may be formed between the first buffer layer BF1 and the active layer 121.

The gate insulating layer 130 may be formed on the active layer 121. The gate insulating layer 130 may be formed of an inorganic layer, for example, a silicon nitride layer, a silicon oxynitride layer, a silicon oxide layer, a titanium oxide layer, or an aluminum oxide layer.

The gate electrode 122 and gate lines may be formed on the gate insulating layer 130. The gate electrode 122 and the gate lines may be made up of a single layer or multiple layers of one of molybdenum (Mo), aluminum (Al), chromium (Cr), gold (Au), titanium (Ti), nickel (Ni), neodymium (Nd), copper (Cu), or an alloy thereof.

The interlayer dielectric layer 140 may be formed over the gate electrode 122 and the gate lines. The interlayer dielectric layer 140 may be formed of an inorganic layer, for example, a silicon nitride layer, a silicon oxynitride layer, a silicon oxide layer, a titanium oxide layer, or an aluminum oxide layer.

The source electrode 123 and the drain electrode 124 may be formed on the interlayer dielectric layer 140. Each of the source electrode 123 and the drain electrode 124 may be connected to the active layer 121 through a contact hole penetrating through the gate insulating layer 130 and the interlayer dielectric layer 140. The source electrode 123 and the drain electrode 124 may be made up of a single layer or multiple layers of one of molybdenum (Mo), aluminum (Al), chromium (Cr), gold (Au), titanium (Ti), nickel (Ni), neodymium (Nd), copper (Cu), or an alloy thereof.

The protective layer 150 may be formed on the source electrode 123 and the drain electrode 124 to insulate the thin-film transistors 120. The protective layer 150 may be formed of an inorganic layer, for example, a silicon nitride layer, a silicon oxynitride layer, a silicon oxide layer, a titanium oxide layer, or an aluminum oxide layer.

The planarization layer 160 may be formed on the protective layer 150 to provide a flat surface over the step differences of the thin-film transistors 120. The planarization layer 160 may be formed of an organic layer such as an acryl resin, an epoxy resin, a phenolic resin, a polyamide resin, or a polyimide resin.

The emission material layer EML is formed on the thin-film transistor layer TFTL. The emission material layer EML includes light-emitting elements 170 and a bank 180.

The light-emitting elements 170 and the bank 180 are formed on the planarization layer 160. Each of the light-emitting elements 170 may include a first electrode 171, the organic emitting layer 172, and a second electrode 173.

The first electrode 171 may be formed on the planarization layer 160. The first electrode 171 is connected to the source electrode 123 of the thin-film transistor 120 through the contact hole penetrating through the protective layer 150 and the planarization layer 160.

In a top-emission organic light-emitting diode where light exits from the organic emitting layer 172 toward the second electrode 173, the first electrode 171 may be made of a metal material having a high reflectivity such as a stack structure of aluminum and titanium (Ti/Al/Ti), a stack structure of aluminum and ITO (ITO/Al/ITO), an APC alloy, or a stack structure of APC alloy and ITO (ITO/APC/ITO). The APC alloy is an alloy of silver (Ag), palladium (Pd), and copper (Cu).

In a bottom-emission organic light-emitting diode where light exits from the organic emitting layer 172 toward the first electrode 171, the first electrode 171 may be formed of a transparent conductive material (TCP) such as ITO or IZO that can transmit light, or a semi-transmissive conductive material such as magnesium (Mg), silver (Ag), or an alloy of magnesium (Mg) and silver (Ag). In such a case, when the first electrode 171 is made of a semi-transmissive metal material, the light extraction efficiency can be increased by using microcavities.

The bank 180 may be formed to separate the first electrode 171 from another one on the planarization layer 160 to define the pixels P. The bank 180 may be formed to cover the edge of the first electrode 171. The bank 180 may be formed of an organic layer such as an acryl resin, an epoxy resin, a phenolic resin, a polyamide resin, or a polyimide resin.

In each of the pixels P, the first electrode 171, the organic emitting layer 172, and the second electrode 173 are formed so that holes from the first electrode 171 and electrons from the second electrode 173 are combined with each other in the organic emitting layer 172 to emit light. Each of the pixels P may include the light-emitting element 170.

The organic emitting layer 172 is formed on the first electrode 171 and the bank 180. The organic emitting layer 172 may include an organic material and emit light of a certain color. For example, the organic emitting layer 172 may include a hole transporting layer, an organic material layer, and an electron transporting layer. In such a case, the organic emitting layer 172 may emit light of the first color to the third color. The first color may be red, the second color may be green, and the third color may be blue. It is, however, to be understood that the inventive concept is not limited thereto. In exemplary embodiments of the inventive concept, the organic emitting layer 172 may emit white light. In such a case, a color filter layer may be further disposed on the organic emitting layer 172.

The second electrode 173 is formed on the organic emitting layer 172. The second electrode 173 may be formed to cover the organic emitting layer 172. The second electrode 173 may be a common layer formed across sub-pixels RP, GP, and BP. A capping layer may be formed on the second electrode 173.

In the top-emission organic light-emitting diode, the second electrode 173 may be formed of a transparent conductive material (TCP) such as ITO or IZO that can transmit light, or a semi-transmissive conductive material such as magnesium (Mg), silver (Ag), or an alloy of magnesium (Mg) and silver (Ag). When the second electrode 173 is formed of a transflective conductive material, the light extraction efficiency can be increased by using microcavities.

In the bottom-emission organic light-emitting diode, the second electrode 173 may be made of a metal material having a high reflectivity such as a stack structure of aluminum and titanium (Ti/Al/Ti), a stack structure of aluminum and ITO (ITO/Al/ITO), an APC alloy, or a stack structure of APC alloy and ITO (ITO/APC/ITO). The APC alloy is an alloy of silver (Ag), palladium (Pd), and copper (Cu).

The thin-film encapsulation layer TFEL is formed on the emission material layer EML. The thin-film encapsulation layer TFEL includes an encapsulation layer 190.

The encapsulation layer 190 is disposed on the second electrode 173. The encapsulation layer 190 may include at least one inorganic layer to prevent oxygen or moisture from permeating into the organic emitting layer 172 and the second electrode 173. In addition, the encapsulation layer 190 may include at least one organic layer to protect the emission material layer EML from foreign substances such as dust. For example, the encapsulation layer 190 may include a first inorganic layer disposed on the second electrode 173, an organic layer disposed on the first inorganic layer, and a second inorganic layer disposed on the organic layer. The first inorganic layer and the second inorganic layer may be formed of, but is not limited to, a silicon nitride layer, a silicon oxynitride layer, a silicon oxide layer, a titanium oxide layer, or an aluminum oxide layer. The organic layer may be formed of, but is not limited to, an acryl resin, an epoxy resin, a phenolic resin, a polyamide resin, or a polyimide resin.

A second buffer layer BF2 is formed on the thin-film encapsulation layer TFEL. The second buffer layer BF2 may be made of an organic material. For example, the second buffer layer BF2 may be formed of an acryl resin, an epoxy resin, a phenolic resin, a polyamide resin, a polyimide resin, etc. It is, however, to be understood that this is merely illustrative.

In exemplary embodiments of the inventive concept, a first insulating pattern IP1 may be disposed on the second buffer layer BF2. The first insulating pattern IP1 may overlap the driving electrode TE and the sensing electrode RE in the third direction (z-axis direction). For example, as shown in FIG. 8, the first insulating pattern IP1 may be disposed between the second buffer layer BF2 and either the driving electrode TE or the sensing electrode RE, and may overlap with the driving electrode TE and the sensing electrode RE in the third direction (z-axis direction) that is the thickness direction. In exemplary embodiments of the inventive concept, a width W1 of the first insulating pattern IP1 may be greater than a width W3 of the driving electrode TE. It is, however, to be understood that the inventive concept is not limited thereto. The width W1 of the first insulating pattern IP1 may be less than or equal to the width W3 of the driving electrode TE.

In exemplary embodiments of the inventive concept, the first insulating pattern IP1 may not overlap with the pixels P in the third direction (z-axis direction). For example, the first insulating pattern IP1 may have a mesh shape surrounding the pixels P.

For example, the first insulating pattern IP1 may be made of an inorganic material. For example, the first insulating pattern IP1 may include, but is not limited to, a silicon nitride layer, a silicon oxynitride layer, a silicon oxide layer, a titanium oxide layer, or an aluminum oxide layer.

As shown in FIGS. 9 and 10, the connection electrode BE may be positioned on the first insulating pattern IP1. The connection electrode BE may overlap the first insulating pattern IP1 in the third direction (z-axis direction).

In exemplary embodiments of the inventive concept, a first insulating layer IL1 may be disposed on the second buffer layer BF2, the first insulating pattern IP1, and the connection electrode BE. The first insulating layer IL1 may include the contact hole CNT via which the connection electrode BE is exposed, and the driving electrode TE and the connection electrode BE may be electrically connected to each other through the contact hole CNT. As described above, the connection electrode BE may electrically connect the driving electrodes TE in the second direction (y-axis direction).

The connection electrodes BE may be formed as, but are not limited to, a stack structure of aluminum and titanium (Ti/Al/Ti), a stack structure of aluminum and ITO (ITO/Al/ITO), an APC alloy, or a stack structure of APC alloy and ITO (ITO/APC/ITO).

The first insulating layer IL1 may be made of an organic material. For example, the first insulating layer IL1 may be, but is not limited to, an acryl resin, an epoxy resin, a phenolic resin, a polyamide resin, or a polyimide resin.

The first insulating layer IL1 may be in contact with each of the second buffer layer BF2, the first insulating pattern IP1, and the connection electrode BE.

The driving electrode TE, the sensing electrode RE, and a second insulating pattern IP2 may be disposed on the first insulating layer IL1.

In exemplary embodiments of the inventive concept, the driving electrode TE and the sensing electrode RE may overlap the first insulating pattern IP1 in the third direction (z-axis direction), and each of the driving electrode TE and the sensing electrode RE may be in the form of a mesh surrounding the pixels P.

The driving electrodes TE and the sensing electrodes RE may be formed as, but are not limited to, a stack structure of aluminum and titanium (Ti/Al/Ti), a stack structure of aluminum and ITO (ITO/Al/ITO), an APC alloy, or a stack structure of APC alloy and ITO (ITO/APC/ITO).

The second insulating pattern IP2 may be located in mesh holes MH formed by the driving electrodes TE and the sensing electrodes RE.

The second insulating pattern IP2 may be formed in an island shape positioned within the mesh hole MH and may overlap the pixels P in the third direction (z-axis direction). As shown in FIG. 8, a width W2 of the second insulating pattern IP2 may be greater than a width of the pixel P. It is, however, to be understood that this is merely illustrative.

In exemplary embodiments of the inventive concept, the second insulating pattern IP2 and the first insulating pattern IP1 may not overlap each other in the third direction (z-axis direction). It is, however, to be understood that the inventive concept is not limited thereto. In exemplary embodiments of the inventive concept, the second insulating pattern IP2 and the first insulating pattern IP1 may partially overlap each other.

As shown in FIG. 7, in exemplary embodiments of the inventive concept, the second insulating pattern IP2 may not overlap the driving electrodes TE and the sensing electrodes RE in the third direction (z-axis direction). It is, however, to be understood that the inventive concept is not limited thereto. The second insulating pattern IP2 may be in contact with the driving electrodes TE and the sensing electrodes RE, and in exemplary embodiments of the inventive concept, the second insulating pattern IP2 may overlap a portion of the driving electrodes TE and a portion of the sensing electrodes RE.

As shown in FIG. 8, in exemplary embodiments of the inventive concept, a distance W4 between the second insulating patterns IP2 spaced apart from one another in an island shape may be greater than the width W3 of the driving electrodes TE. It is, however, to be understood that the inventive concept is not limited thereto. In exemplary embodiments of the inventive concept, the distance W4 between the second insulating patterns IP2 spaced apart from one another in an island shape may be equal to the width W3 of the driving electrode TE. In such a case, the second insulating pattern IP2 may be in contact with the driving electrode TE and the sensing electrode RE. In addition, in exemplary embodiments of the inventive concept, the distance W4 between the second insulating patterns IP2 spaced apart from one another in an island shape may be less than the width W3 of the driving electrode TE. In such a case, the second insulating pattern IP2 may be in contact with a portion of the driving electrode TE and the sensing electrode RE. Although the driving electrode TE has been described above with reference to FIG. 8, the second insulating pattern IP2 and the sensing electrode RE have the same arrangement.

In addition, in exemplary embodiments of the inventive concept, the width W2 of the second insulating pattern IP2 may be greater than the width of the pixel P. In exemplary embodiments of the inventive concept, the thickness of the second insulating pattern IP2 in the third direction (z-axis direction) may be greater than the thickness of the driving electrode TE. It is, however, to be understood that the inventive concept is not limited thereto. In exemplary embodiments of the inventive concept, the thickness of the second insulating pattern IP2 in the third direction (z-axis direction) may be less than or equal to the thickness of the driving electrode TE.

As shown in FIG. 10, the second insulating pattern IP2 may not overlap the connection electrode BE in the third direction (z-axis direction).

The second insulating pattern IP2 may be made of an inorganic material. For example, the second insulating pattern IP2 may be formed of an inorganic layer, e.g., a silicon nitride layer, a silicon oxynitride layer, a silicon oxide layer, a titanium oxide layer, an aluminum oxide layer, etc. It is, however, to be understood that this is merely illustrative.

In exemplary embodiments of the inventive concept, a second insulating layer IL2 may be disposed on the second insulating pattern IP2, the driving electrode TE, and the sensing electrode RE. The second insulating layer IL2 may be made of an organic material. For example, the second insulating layer IL2 may be, but is not limited to, an acryl resin, an epoxy resin, a phenolic resin, a polyamide resin, or a polyimide resin.

As such, the first insulating pattern IP1 is disposed between the second buffer layer BF2 and the first insulating layer IL1 in the touch detecting unit TDU, and the second insulating pattern IP2 is disposed between the first insulating layer IL1 and the second insulating layer IL2 so that external impact can be absorbed in the touch detecting unit TDU. Accordingly, it is possible to effectively prevent damage or deformation of the display unit DU by an external impact, thus improving impact resistance of the display device 10.

Figure 11:
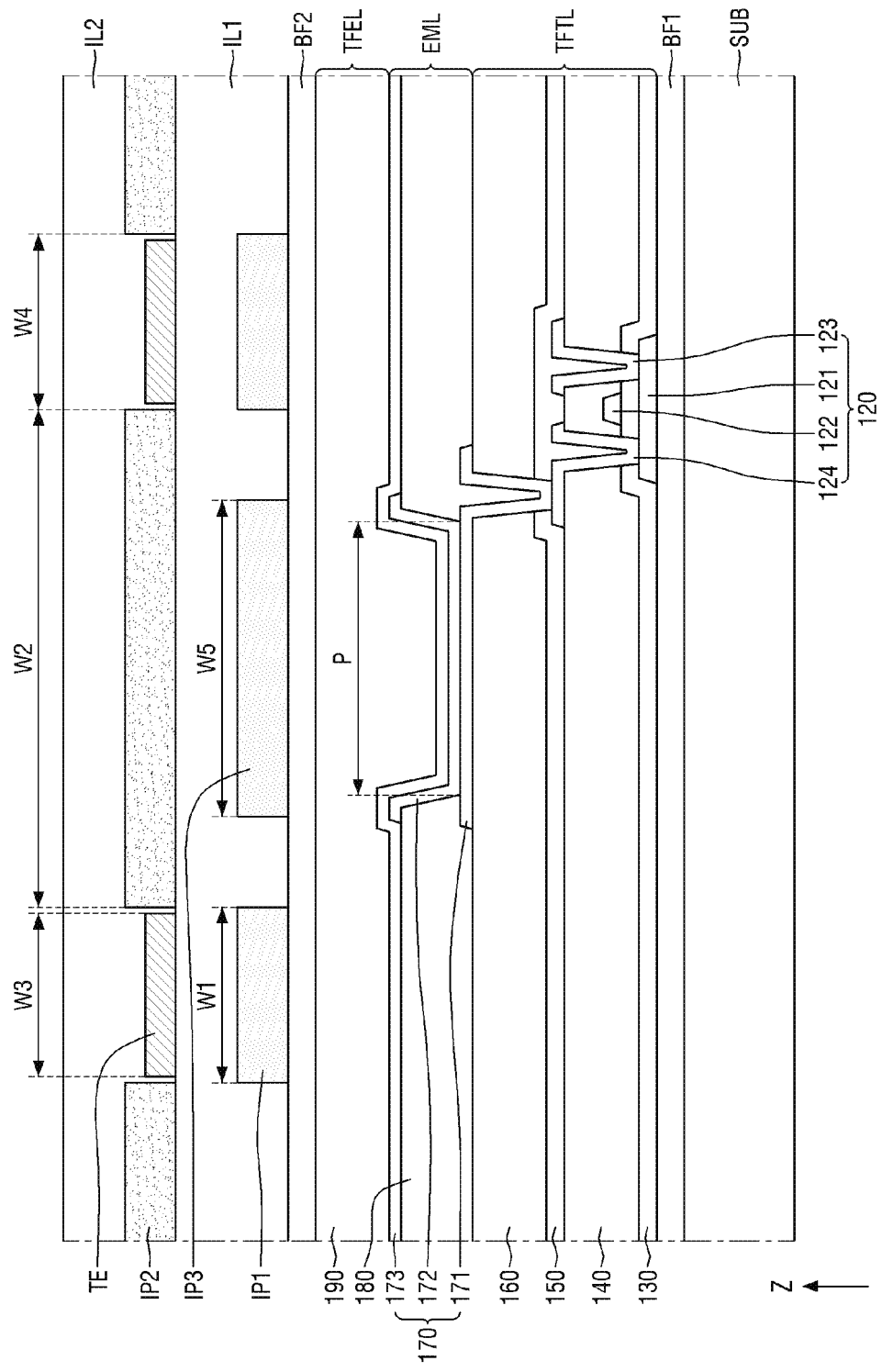
FIG. 11 is a cross-sectional view of a display device according to an exemplary embodiment of the inventive concept.

FIG. 11 is a cross-sectional view of a display device according to an exemplary embodiment of the inventive concept. The display device according to the exemplary embodiment shown in FIG. 11 is substantially identical to the display device according to the exemplary embodiment shown in FIG. 8 except that a third insulating pattern IP3 is disposed between first insulating patterns IP1. In the following descriptions, differences from the above exemplary embodiments will be described, and redundant descriptions will be omitted.

Referring to FIG. 11, in exemplary embodiments of the inventive concept, the third insulating pattern IP3 may be disposed on the second buffer layer BF2. For example, the third insulating pattern IP3 may be disposed between the first insulating patterns IP1.

The third insulating pattern IP3 may be disposed between the first insulating patterns IP1 and spaced apart from the first insulating patterns IP1. In addition, the third insulating pattern IP3 may not overlap the driving electrode TE in the third direction (z-axis direction). In exemplary embodiments of the inventive concept, the third insulating pattern IP3 may not overlap the sensing electrode RE and the connection electrode BE in the third direction (z-axis direction).

The third insulating pattern IP3 may be formed in an island shape, and may overlap the pixel P and the second insulating pattern IP2 in the third direction (z-axis direction). In exemplary embodiments of the inventive concept, a width W5 of the third insulating pattern IP3 may be greater than the width of the pixel P, but may be less than the width W2 of the second insulating pattern IP2. It is, however, to be understood that this is merely illustrative.

The third insulating pattern IP3 may be made of an inorganic material. For example, the third insulating pattern IP3 may include, but is not limited to, a silicon nitride layer, a silicon oxynitride layer, a silicon oxide layer, a titanium oxide layer, or an aluminum oxide layer.

As such, the third insulating pattern IP3 may be further disposed between the second buffer layer BF2 and the first insulating layer IL1 to further improve the impact resistance of the display device 10.

Figure 12:
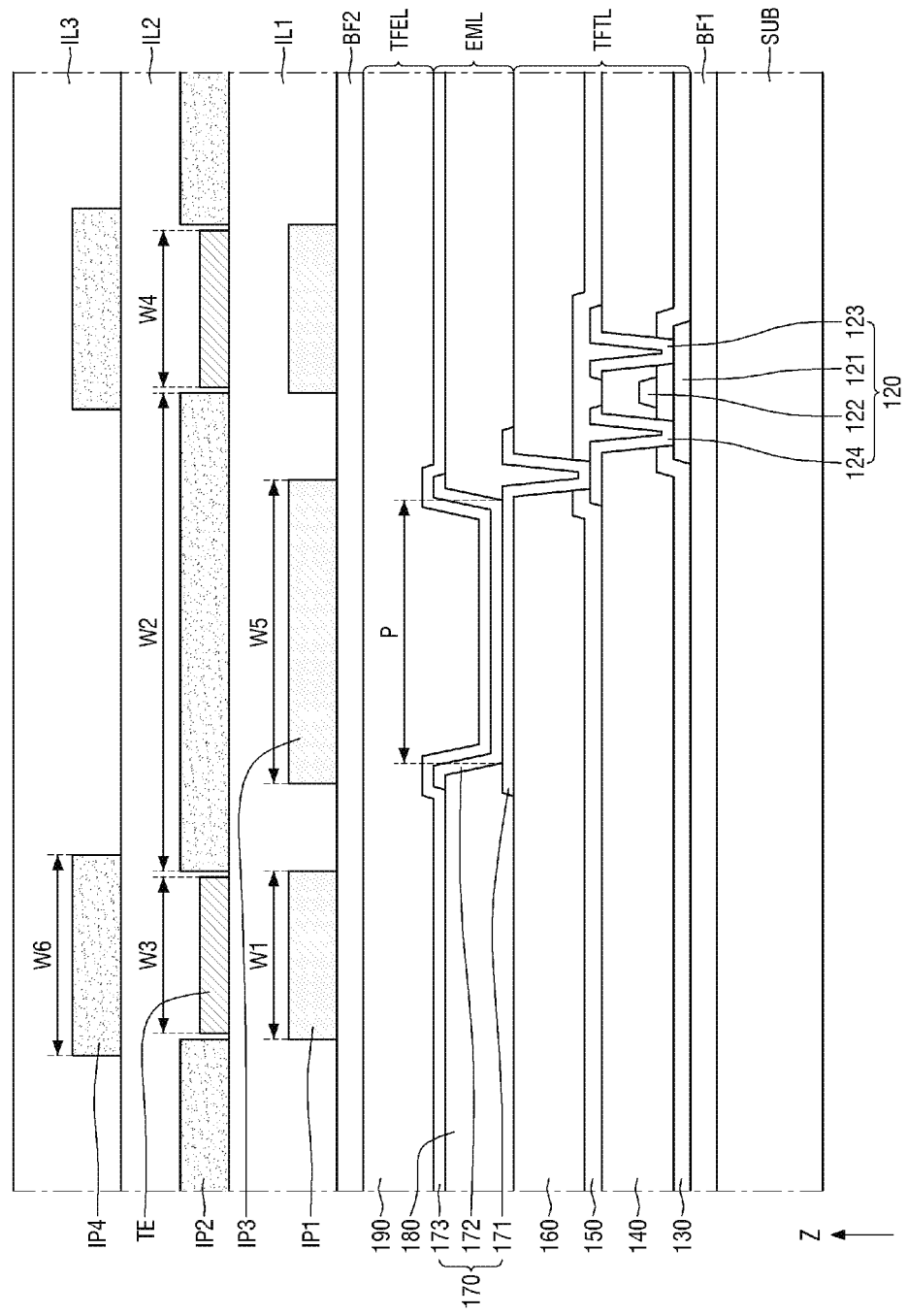
FIG. 12 is a cross-sectional view of a display device according to an exemplary embodiment of the inventive concept.

FIG. 12 is a cross-sectional view of a display device according to an exemplary embodiment of the inventive concept. A display device according to the exemplary embodiment of FIG. 12 is substantially identical to the display device according to the exemplary embodiment of FIG. 11 except that a fourth insulating pattern IP4 is further disposed on the second insulating layer IL2 and a third insulating layer IL3 is disposed on the fourth insulating pattern IP4. In the following descriptions, differences from the above exemplary embodiments will be described, and redundant descriptions will be omitted.

Referring to FIG. 12, the fourth insulating pattern IP4 may be disposed on the second insulating layer IL2. The fourth insulating pattern IP4 may overlap the first insulating pattern IP1 and the driving electrode TE in the third direction (z-axis direction). In exemplary embodiments of the inventive concept, the fourth insulating pattern IP4 may not overlap the connection electrode BE and the sensing electrode RE in the third direction (z-axis direction).

In exemplary embodiments of the inventive concept, a width W6 of the fourth insulating pattern IP4 may be greater than the distance W4 of the second insulating pattern IP2. In such a case, the fourth insulating pattern IP4 may overlap a portion of the second insulating pattern IP2 in the third direction (z-axis direction). It is, however, to be understood that the inventive concept is not limited thereto. In exemplary embodiments of the inventive concept, the width W6 of the fourth insulating pattern IP4 may be equal to the distance W4 of the second insulating pattern IP2. In such a case, the fourth insulating pattern IP4 may not overlap the second insulating pattern IP2 in the third direction (z-axis direction).

In exemplary embodiments of the inventive concept, the width W6 of the fourth insulating pattern IP4 may be greater than the width W1 of the first insulating pattern IP1. It is, however, to be understood that the inventive concept is not limited thereto. The width W6 of the fourth insulating pattern IP4 may be equal to the width W1 of the first insulating pattern IP1. In exemplary embodiments of the inventive concept, the width W6 of the fourth insulating pattern IP4 may be greater than the width W3 of the driving electrode TE. It is, however, to be understood that the inventive concept is not limited thereto. In exemplary embodiments of the inventive concept, the width W6 of the fourth insulating pattern IP4 may be equal to the width W3 of the driving electrode TE.

The fourth insulating pattern IP4 may be made of an inorganic material. For example, the fourth insulating pattern IP4 may include, but is not limited to, a silicon nitride layer, a silicon oxynitride layer, a silicon oxide layer, a titanium oxide layer, or an aluminum oxide layer.

The third insulating layer IL3 may be disposed on the fourth insulating pattern IP4. The third insulating layer IL3 may be in contact with each of the second insulating layer IL2 and the fourth insulating pattern IP4. In exemplary embodiments of the inventive concept, the third insulating layer IL3 may be made of an organic material. For example, the third insulating layer IL3 may be, but is not limited to, an acryl resin, an epoxy resin, a phenolic resin, a polyamide resin, or a polyimide resin.

As such, the fourth insulating pattern IP4 may be further disposed on the second insulating layer IL2 to further improve the impact resistance of the display device 10.

Figure 13:
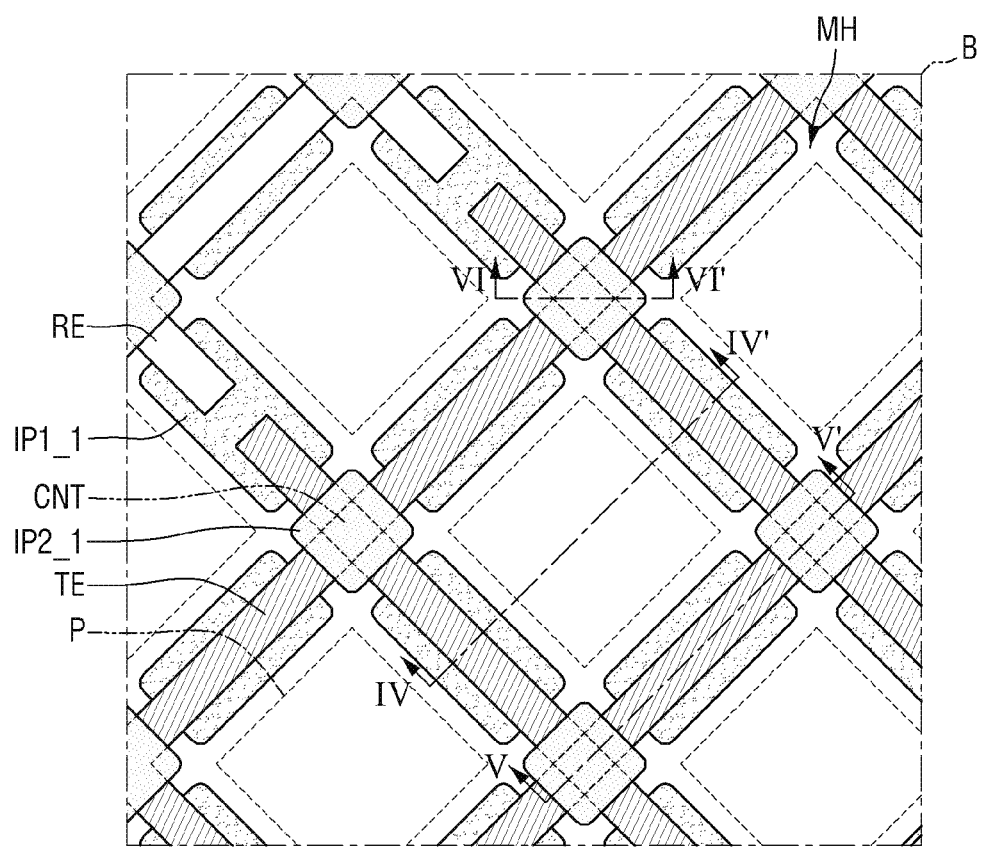
FIG. 13 is a plan view of a display device according to an exemplary embodiment of the inventive concept.
Figure 13:
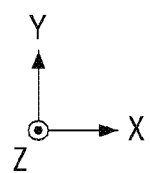
Figure 14:
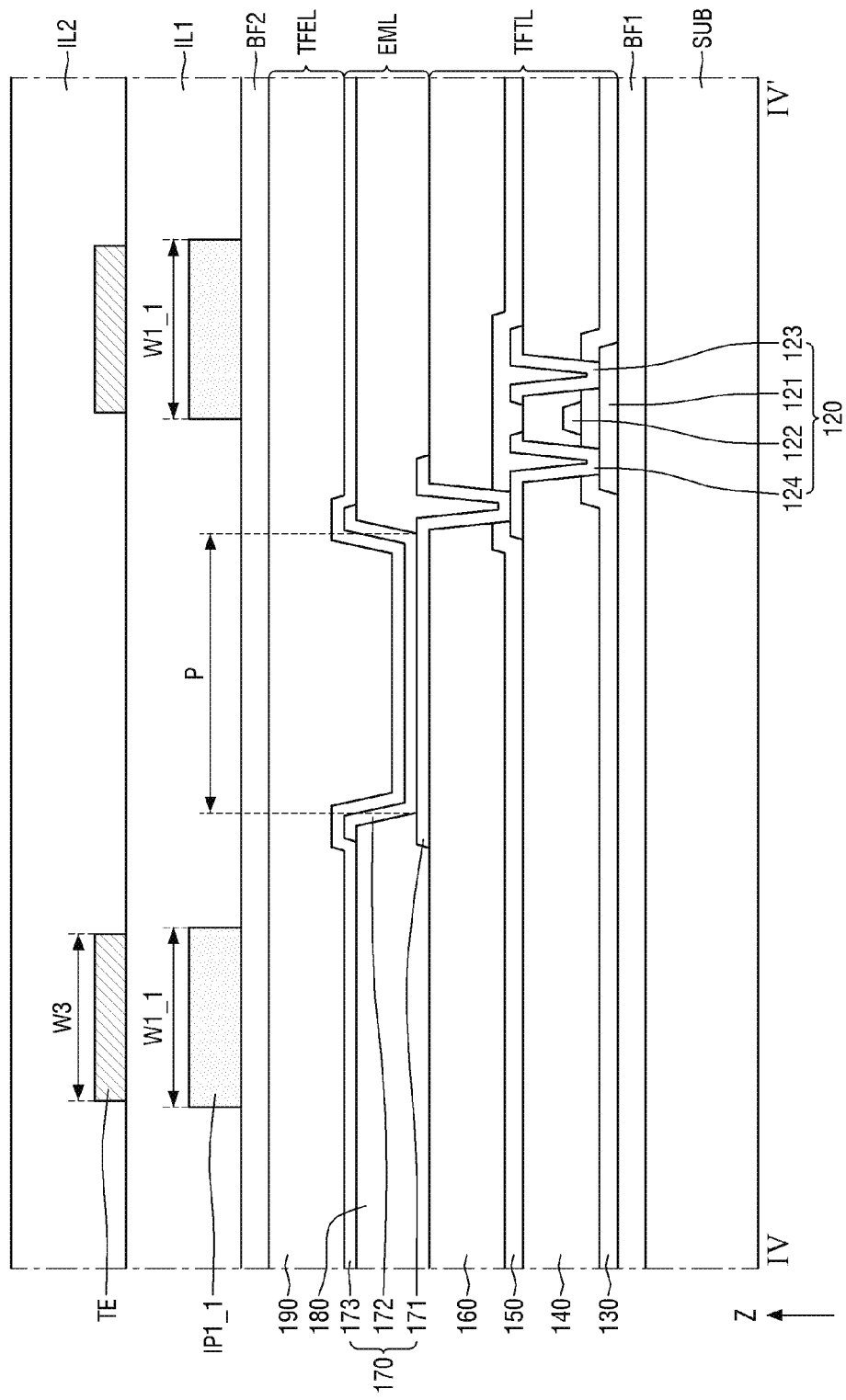
FIG. 14 is a cross-sectional view taken along line IV-IV' of FIG. 13 according to an exemplary embodiment of the inventive concept.
Figure 15:
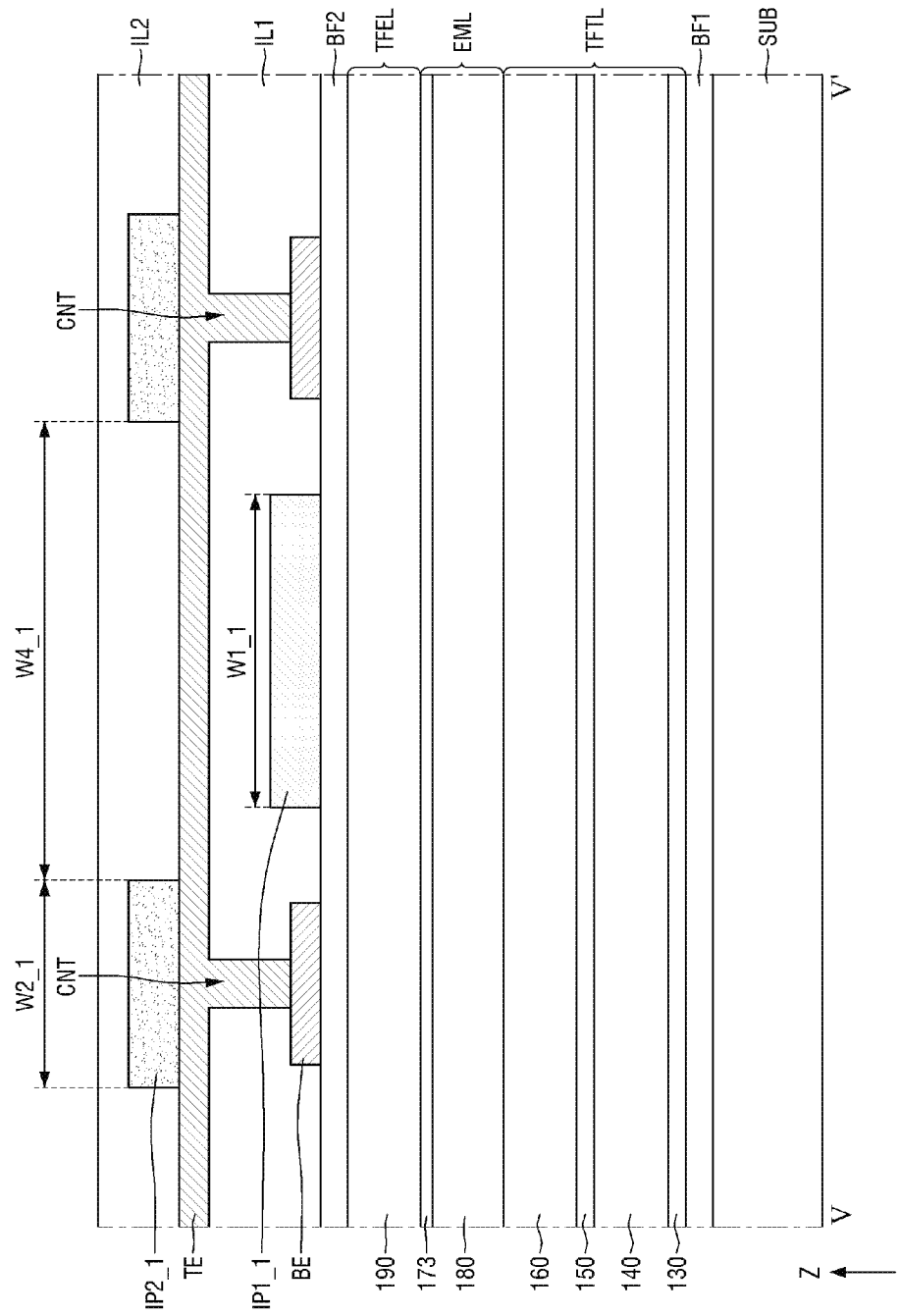
FIG. 15 is a cross-sectional view taken along line V-V' of FIG. 13 according to an exemplary embodiment of the inventive concept.
Figure 16:
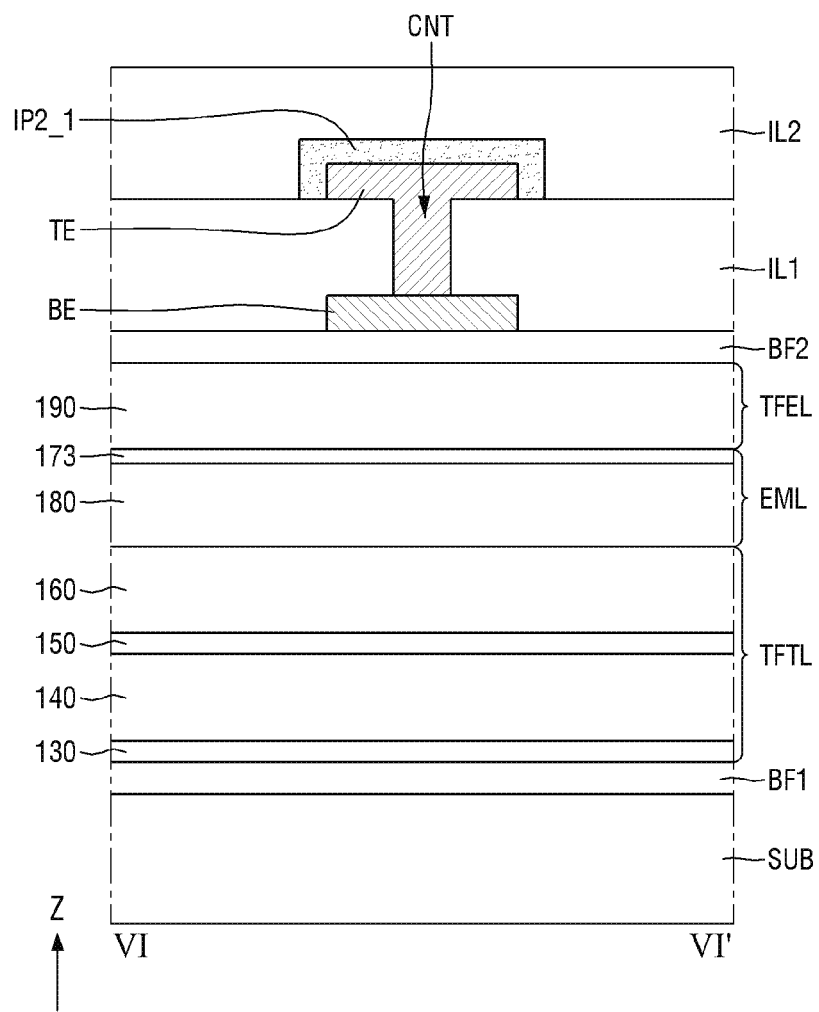
FIG. 16 is a cross-sectional view taken along line VI-VI' of FIG. 13 according to an exemplary embodiment of the inventive concept.

FIG. 13 is a plan view of a display device according to an exemplary embodiment of the inventive concept. FIG. 14 is a cross-sectional view taken along line IV-IV' of FIG. 13 according to an exemplary embodiment of the inventive concept. FIG. 15 is a cross-sectional view taken along line V-V' of FIG. 13 according to an exemplary embodiment of the inventive concept. FIG. 16 is a cross-sectional view taken along line VI-VI' of FIG. 13 according to an exemplary embodiment of the inventive concept. The display device according to the exemplary embodiment shown in FIGS. 13 to 16 is substantially identical to the display device according to the exemplary embodiment shown in FIGS. 7 to 10 except that the shape and location of a first insulating pattern IP1_1 and a second insulating pattern IP2_1 are altered. The description below will focus on differences, and redundant descriptions will be omitted.

Referring to FIGS. 13 to 16, in exemplary embodiments of the inventive concept, a first insulating pattern IP1_1 may be disposed on the second buffer layer BF2. In exemplary embodiments of the inventive concept, the first insulating pattern IP1_1 may be disposed on the second buffer layer BF2 in an island shape. For example, as shown in FIG. 13, the first insulating pattern IP1_1 may overlap with a portion of the driving electrode TE and the sensing electrode RE in the third direction (z-axis direction). In exemplary embodiments of the inventive concept, the first insulating pattern IP1_1 may not overlap with the corners of the driving electrode TE and the sensing electrode RE in the third direction (z-axis direction).

In exemplary embodiments of the inventive concept, a width W1_1 of the first insulating pattern IP1_1 may be greater than the width W3 of the driving electrode TE. It is, however, to be understood that the inventive concept is not limited thereto. The width W1_1 of the first insulating pattern IP1_1 may be less than or equal to the width W3 of the driving electrode TE.

In exemplary embodiments of the inventive concept, the first insulating pattern IP1_1 may not overlap with the pixels P in the third direction (z-axis direction).

The first insulating pattern IP1_1 may be made of an inorganic material. For example, the first insulating pattern IP1_1 may include, but is not limited to, a silicon nitride layer, a silicon oxynitride layer, a silicon oxide layer, a titanium oxide layer, or an aluminum oxide layer.

As shown in FIG. 15, the first insulating pattern IP1_1 and the connection electrode BE may be disposed on the same layer, and may be spaced apart from each other in the first direction (x-axis direction) and the second direction (y-axis direction), In exemplary embodiments of the inventive concept, the first insulating layer IL1 may be disposed on the second buffer layer BF2, the first insulating pattern IP1_1, and the connection electrode BE. The first insulating layer IL1 may include the contact hole CNT via which the connection electrode BE is exposed, and the driving electrode TE and the connection electrode BE may be electrically connected to each other through the contact hole CNT. As described above, the connection electrode BE may electrically connect the driving electrodes TE in the second direction (y-axis direction).

The first insulating layer IL1 may be made of an organic material. For example, the first insulating layer IL1 may be, but is not limited to, an acryl resin, an epoxy resin, a phenolic resin, a polyamide resin, or a polyimide resin.

The first insulating layer IL1 may be in contact with each of the second buffer layer BF2, the first insulating pattern IP1_1, and the connection electrode BE.

In exemplary embodiments of the inventive concept, the driving electrode TE and the sensing electrode RE may be disposed on the first insulating layer ILL and second insulating patterns IP2_1 may be disposed on the first insulating layer ILL the driving electrode TE, and the sensing electrode RE. The second insulating pattern IP2_1 may have a width W2_1.

In exemplary embodiments of the inventive concept, as shown in FIG. 13, the second insulating pattern IP2_1 may not overlap the corners of the driving electrode TE and the sensing electrode RE in the third direction (z-axis direction). In exemplary embodiments of the inventive concept, as shown in FIG. 16, the second insulating pattern IP2_1 may overlap the upper surface and side surfaces of the driving electrode TE.

The second insulating pattern IP2_1 may not overlap with the pixels P in the third direction (z-axis direction). In exemplary embodiments of the inventive concept, each of the second insulating pattern IP2_1 and the first insulating pattern IP1_1 may be formed in an island shape, and may not overlap each other in the third direction (z-axis direction). It is, however, to be understood that the inventive concept is not limited thereto. In exemplary embodiments of the inventive concept, the second insulating pattern IP2_1 and the first insulating pattern IP1_1 may partially overlap each other.

As shown in FIG. 15, in exemplary embodiments of the inventive concept, a distance W4_1 between the second insulating patterns IP2_1 spaced apart from each other in an island shape may be greater than the width W1_1 of the first insulating layer pattern IP1_1. It is, however, to be understood that the inventive concept is not limited thereto. In exemplary embodiments of the inventive concept, the distance W4_1 between the second insulating patterns IP2_1 spaced apart from each other in an island shape may be equal to the width W1_1 of the first insulating pattern IP1_1. In such a case, the second insulating pattern IP2_1 may be in contact with the first insulating pattern IP1_1 when viewed from the top. It is, however, to be understood that the inventive concept is not limited thereto. In exemplary embodiments of the inventive concept, the distance W4_1 between the second insulating patterns IP2_1 spaced apart from each other in an island shape may be less than the width W1_1 of the first insulating pattern IP1_1. In such a case, the second insulating pattern IP2_1 may overlap with the first insulating pattern IP1_1 when viewed from the top.

In exemplary embodiments of the inventive concept, the thickness of the second insulating pattern IP2_1 in the third direction (z-axis direction) may be greater than the thickness of the driving electrode TE. It is, however, to be understood that the inventive concept is not limited thereto. In exemplary embodiments of the inventive concept, the thickness of the second insulating pattern IP2_1 in the third direction (z-axis direction) may be less than or equal to the thickness of the driving electrode TE.

As shown in FIGS. 15 and 16, the second insulating pattern IP2_1 may not overlap the connection electrode BE in the third direction (z-axis direction).

The second insulating pattern IP2_1 may be made of an inorganic material. For example, the second insulating pattern IP2_1 may be formed of an inorganic layer, for example, a silicon nitride layer, a silicon oxynitride layer, a silicon oxide layer, a titanium oxide layer, an aluminum oxide layer, etc. It is, however, to be understood that this is merely illustrative.

In exemplary embodiments of the inventive concept, the second insulating layer IL2 may be disposed on the second insulating pattern IP2_1, the driving electrode TE, and the sensing electrode RE. The second insulating layer IL2 may be made of an organic material. For example, the second insulating layer IL2 may be, but is not limited to, an acryl resin, an epoxy resin, a phenolic resin, a polyamide resin, or a polyimide resin.

As such, the first insulating pattern IP1_1 and the second insulating pattern IP2_1 may be arranged in an island shape surrounding the pixel P. In addition, the first insulating pattern IP1_1 and the second insulating pattern IP2_1 may overlap the driving electrode TE and the sensing electrode RE in the third direction (z-axis direction) but may not overlap the pixels P in the third direction (z-axis direction) (e.g., when viewed from the top). Accordingly, the touch detecting unit TDU can absorb an external impact through the first insulating pattern IP1_1 and the second insulating pattern IP2_1, such that it is possible to effectively prevent damage or deformation of the display unit DU by external impact. Thus, the impact resistance of the display device 10 can be improved.

Figure 17:
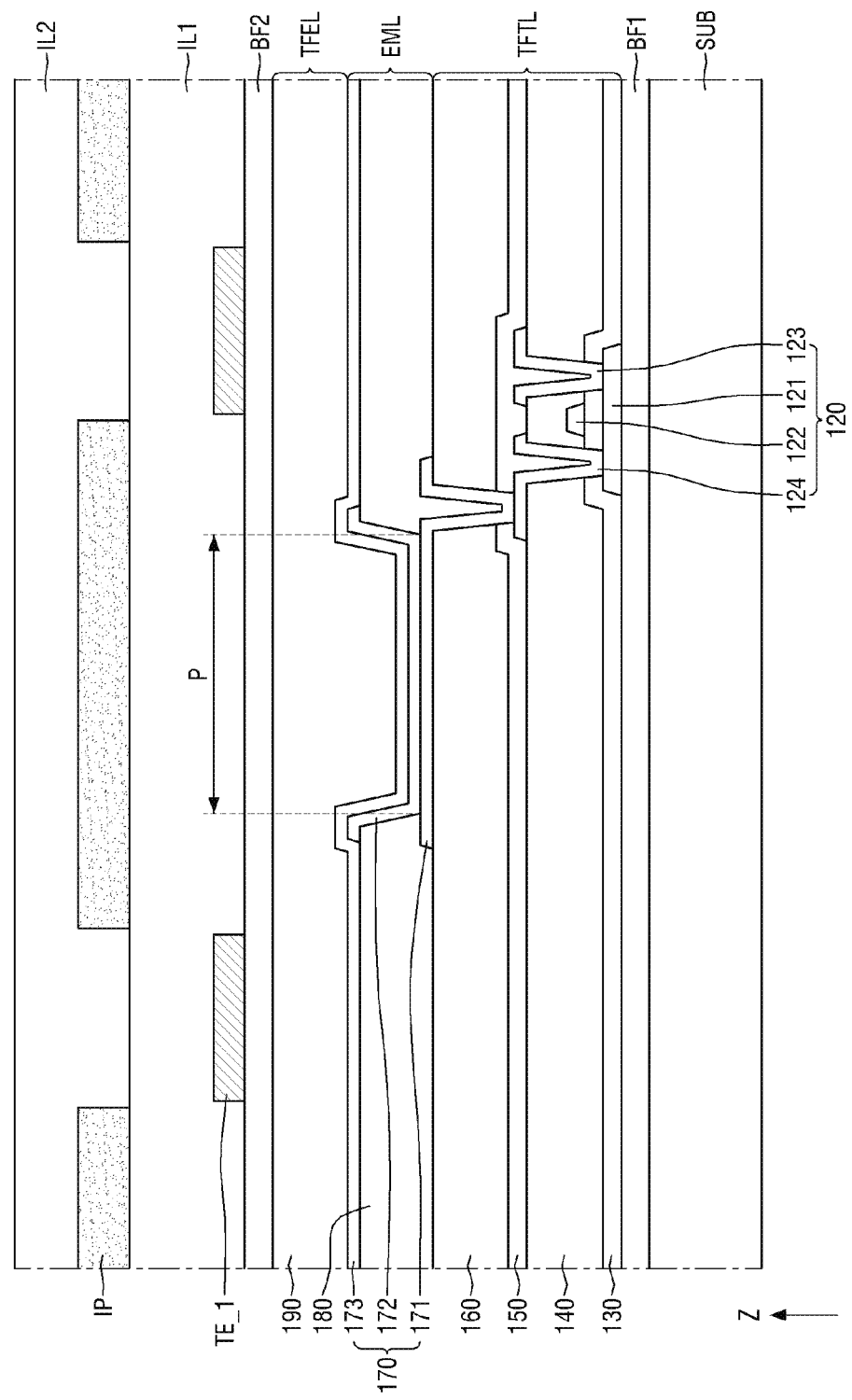
FIG. 17 is a cross-sectional view of a display device according to an exemplary embodiment of the inventive concept.

FIG. 17 is a cross-sectional view of a display device according to an exemplary embodiment of the inventive concept. FIG. 17 is a view showing a modification of an insulating pattern in a structure where touch electrodes are formed on a single layer. Descriptions below will focus on differences with respect to exemplary embodiments described above, and redundant descriptions will be omitted.

Referring to FIG. 17, a driving electrode TE_1 may be disposed on the second buffer layer BF2. A sensing electrode is also disposed on the second buffer layer BF2. As described above, since the touch electrodes form a single layer structure, no separate connection electrode is disposed.

The first insulating layer IL1 may be disposed on the driving electrode TE_1. The first insulating layer IL1 may be made of an organic material. For example, the first insulating layer IL1 may be, but is not limited to, an acryl resin, an epoxy resin, a phenolic resin, a polyamide resin, or a polyimide resin.

An insulating pattern IP may be disposed on the first insulating layer IL1. The insulating pattern IP may not overlap the driving electrode TE_1 in the third direction (z-axis direction). It is, however, to be understood that the inventive concept is not limited thereto. In exemplary embodiments of the inventive concept, the insulating pattern IP may partially overlap the driving electrode TE_1 in the third direction (z-axis direction). In addition, the insulating pattern IP may overlap the pixel P in the third direction (z-axis direction).

The insulating pattern IP may be made of an inorganic material. For example, the insulating pattern IP may include, but is not limited to, a silicon nitride layer, a silicon oxynitride layer, a silicon oxide layer, a titanium oxide layer, or an aluminum oxide layer.

The second insulating layer IL2 may be disposed on the insulating pattern IP. The second insulating layer IL2 may be in contact with the first insulating layer IL1 and the insulating pattern IP. The second insulating layer IL2 may be made of an organic material. For example, the second insulating layer IL2 may be, but is not limited to, an acryl resin, an epoxy resin, a phenolic resin, a polyamide resin, or a polyimide resin.

Figure 18:
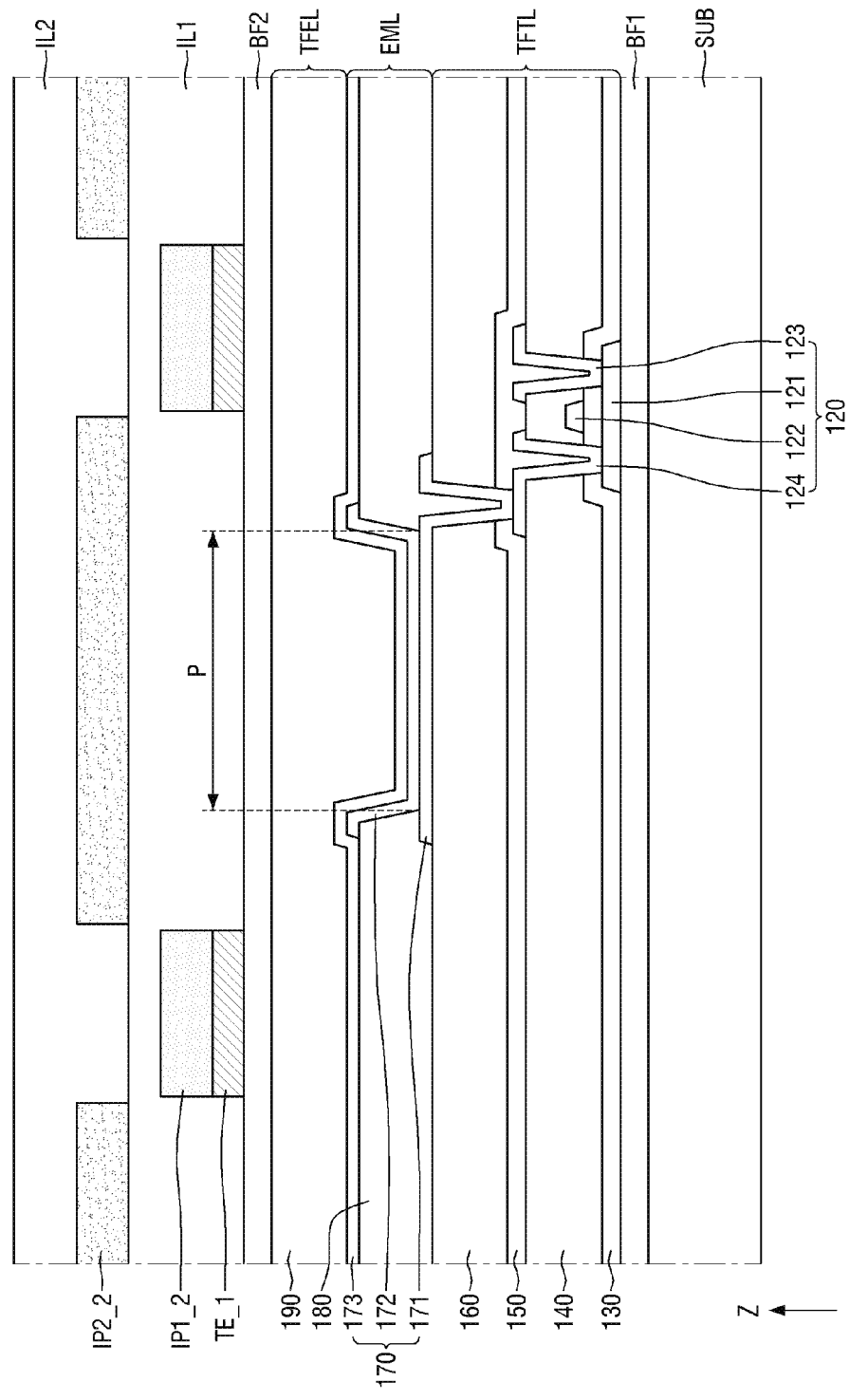
FIG. 18 is a cross-sectional view of a display device according to an exemplary embodiment of the inventive concept.
Figure 19:
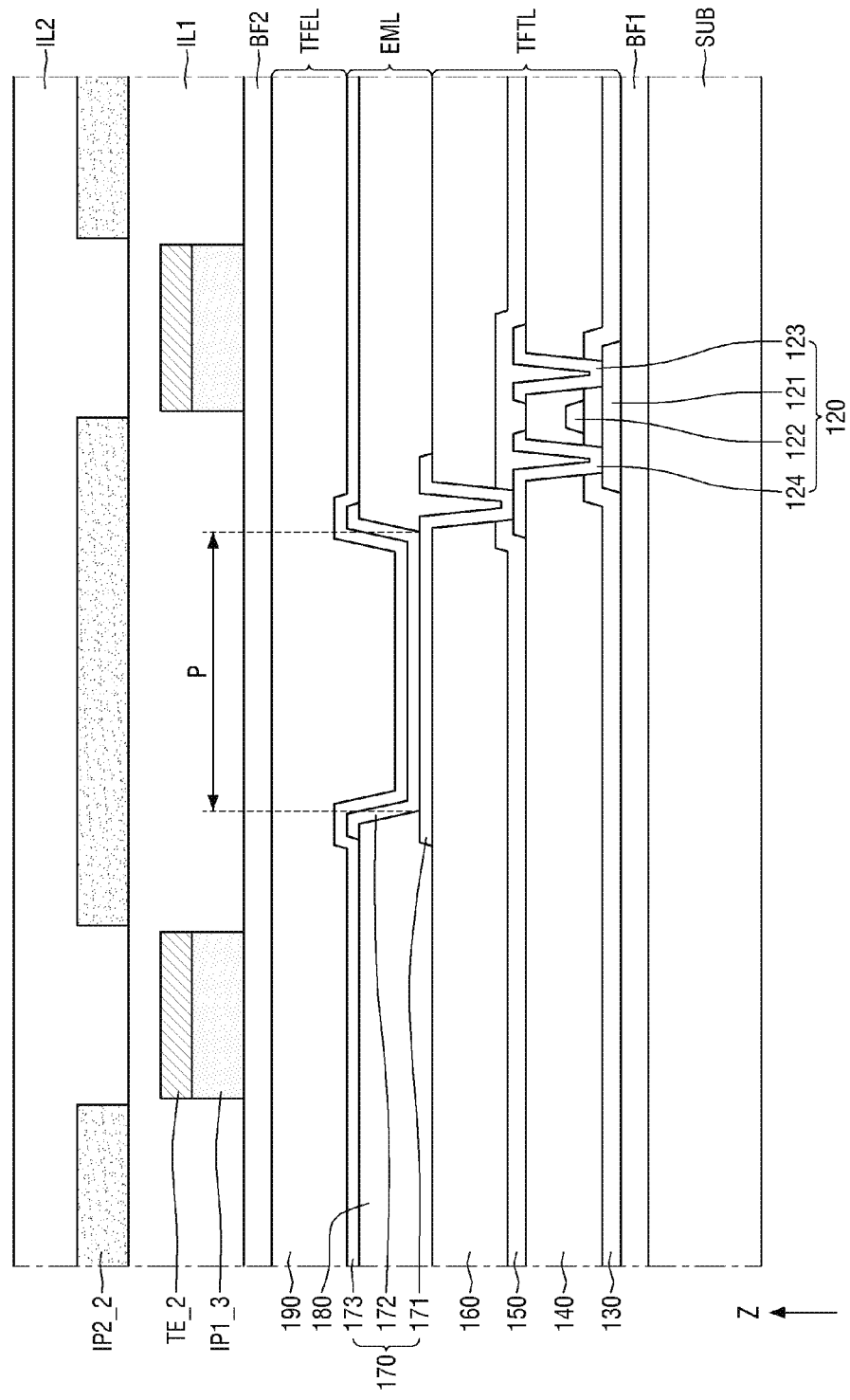
FIG. 19 is a cross-sectional view of a display device according to an exemplary embodiment of the inventive concept.

FIG. 18 is a cross-sectional view of a display device according to an exemplary embodiment of the inventive concept. FIG. 19 is a cross-sectional view of a display device according to an exemplary embodiment of the inventive concept. The display device according to the exemplary embodiments shown in FIGS. 18 and 19 is substantially identical to the display device according to the exemplary embodiment shown in FIG. 17 except that a first insulating pattern IP1_2/IP1_3 and a second insulating pattern IP2_2 are disposed. Descriptions below will focus on differences, and redundant descriptions will be omitted.

Referring to FIG. 18, the driving electrode TE_1 may be disposed on the second buffer layer BF2. A sensing electrode is also disposed on the second buffer layer BF2.

The first insulating pattern IP1_2 may be disposed on the driving electrode TE_1. The first insulating pattern IP1_2 may overlap the driving electrode TE_1 in the third direction (z-axis direction). In addition, the first insulating pattern IP1_2 may be in contact with the driving electrode TE_1. The first insulating pattern IP1_2 may not overlap with the pixels P in the third direction (z-axis direction).

The first insulating pattern IP1_2 may be made of an inorganic material. For example, the first insulating pattern IP1_2 may include, but is not limited to, a silicon nitride layer, a silicon oxynitride layer, a silicon oxide layer, a titanium oxide layer, or an aluminum oxide layer.

The first insulating layer IL1 may be disposed on the first insulating pattern IP1_2 and the second buffer layer BF2. The first insulating layer IL1 may be made of an organic material. For example, the first insulating layer IL1 may be, but is not limited to, an acryl resin, an epoxy resin, a phenolic resin, a polyamide resin, or a polyimide resin.

The second insulating pattern IP2_2 may be disposed on the first insulating layer IL1. The second insulating pattern IP2_2 may not overlap the driving electrode TE_1 and the first insulating pattern IP1_2 in the third direction (z-axis direction). It is, however, to be understood that the inventive concept is not limited thereto. In exemplary embodiments of the inventive concept, the second insulating pattern IP2_2 may partially overlap the driving electrode TE_1 and the first insulating pattern IP1_2 in the third direction (z-axis direction). In addition, the second insulating pattern IP2_2 may overlap with the pixels P in the third direction (z-axis direction).

The second insulating pattern IP2_2 may be made of an inorganic material. For example, the second insulating pattern IP2_2 may include, but is not limited to, a silicon nitride layer, a silicon oxynitride layer, a silicon oxide layer, a titanium oxide layer, or an aluminum oxide layer.

The second insulating layer IL2 may be disposed on the second insulating pattern IP2_2. The second insulating layer IL2 may be in contact with the first insulating layer IL1 and the insulating pattern IP. The second insulating layer IL2 may be made of an organic material. For example, the second insulating layer IL2 may be, but is not limited to, an acryl resin, an epoxy resin, a phenolic resin, a polyamide resin, or a polyimide resin.

Referring to FIG. 19, the first insulating pattern IP1_3 may be disposed on the second buffer layer BF2.

A driving electrode TE_2 may be disposed on the first insulating pattern IP1_3. The first insulating pattern IP1_3 may overlap the driving electrode TE_2 in the third direction (z-axis direction). In addition, one surface of the first insulating pattern IP1_3 may be in contact with the second buffer layer BF2, and the other surface of the first insulating pattern IP1_3 may be in contact with the driving electrode TE_2. The first insulating pattern IP1_3 may not overlap with the pixels P in the third direction (z-axis direction). As described above, the exemplary embodiment of FIG. 19 is substantially identical to the exemplary embodiment of FIG. 18 except that the positions of the first insulation pattern IP1_2/IP1_3 and the driving electrode TE_2 are vertically switched; and, therefore, redundant descriptions will be omitted.

While the inventive concept has been shown and described with reference to exemplary embodiments thereof, it will be apparent to those of ordinary skill in the art that various modifications in form and details may be made thereto without departing from the spirit and scope of the inventive concept as set forth by the appended claims.

What is claimed is:

1. A display device comprising:
   a substrate;
   a pixel disposed on a surface of the substrate, the pixel comprising a first electrode, an emission layer, and a second electrode;
   a buffer layer disposed on the pixel, the buffer layer comprising a first surface facing the pixel and a second surface opposite to the first surface;
   a first insulating pattern disposed on the second surface of the buffer layer; and
   a second insulating pattern disposed on the first insulating pattern and having an island shape, wherein the pixel is disposed between the first surface of the buffer layer and the surface of the substrate, and wherein the second insulating pattern overlaps the pixel in a thickness direction perpendicular to the surface of the substrate.

2. The display device of claim 1, further comprising:
   a first insulating layer disposed between the first insulating pattern and the second insulating pattern; and
   touch electrodes disposed on the first insulating layer and located on a same layer as the second insulating pattern.

3. The display device of claim 2, wherein the touch electrodes comprise mesh holes, and wherein the first insulating pattern overlaps the touch electrodes in the thickness direction.

4. The display device of claim 3, wherein the second insulating pattern is located in the mesh holes.

5. The display device of claim 4, wherein the first insulating pattern and the second insulating pattern do not overlap each other in the thickness direction.

6. The display device of claim 5, wherein
   the second insulating pattern includes a plurality of second insulating patterns spaced apart from one another, and
   a distance between adjacent second insulating patterns among the plurality of second insulating patterns is greater than a width of one of the touch electrodes.

7. The display device of claim 6, further comprising:
   a second insulating layer covering the touch electrodes and the second insulating pattern, wherein the first insulating layer and the second insulating layer include an organic material, and the first insulating pattern and the second insulating pattern include an inorganic material.

8. The display device of claim 7, further comprising:
   a third insulating pattern disposed between the pixel and the second insulating pattern, wherein the third insulating pattern overlaps the pixel and the second insulating pattern in the thickness direction.

9. The display device of claim 8, further comprising: a fourth insulating pattern disposed on the second insulating layer, wherein the fourth insulating pattern overlaps the touch electrodes in the thickness direction.

10. The display device of claim 9, wherein
    the fourth insulating pattern overlaps a portion of the second insulating pattern in the thickness direction, and the fourth insulating pattern does not overlap the pixel in the thickness direction.

11. The display device of claim 10, further comprising:
a third insulating layer covering the fourth insulating pattern and the second insulating layer, wherein the third insulating layer includes an organic material, and the third insulating pattern and the fourth insulating pattern include an inorganic material.

12. The display device of claim 4, wherein a thickness of the second insulating pattern is greater than a thickness of the touch electrodes.

13. The display device of claim 4, wherein the second insulating pattern covers a portion of the touch electrodes.

14. The display device of claim 4, wherein the second insulating pattern is spaced apart from the touch electrodes.

15. A display device comprising:
a substrate;
a pixel disposed on a surface of the substrate, the pixel comprising a first electrode, an emission layer, and a second electrode;
a buffer layer disposed on the pixel, the buffer layer comprising a first surface facing the pixel and a second surface opposite to the first surface;
a first insulating pattern disposed on the second surface of the buffer layer and having an island shape; and
a second insulating pattern disposed on the first insulating pattern and having an island shape, wherein the pixel is disposed between the first surface of the buffer layer and the surface of the substrate, and wherein the first insulating pattern and the second insulating pattern do not overlap the pixel in a thickness direction perpendicular to the surface of the substrate.

16. The display device of claim 15, further comprising:
touch electrodes disposed between the first insulating pattern and the second insulating pattern, wherein the first insulating pattern and the second insulating pattern overlap the touch electrodes in the thickness direction.

17. The display device of claim 16, wherein the first insulating pattern and the second insulating pattern do not overlap each other in the thickness direction.

18. The display device of claim 17, wherein the second insulating pattern covers a side surface of one of the touch electrodes.

19. The display device of claim 18, further comprising:
a first insulating layer disposed between the first insulating pattern and the touch electrodes; and
a second insulating layer covering the touch electrodes and the second insulating pattern.

20. The display device of claim 19, wherein the first insulating layer and the second insulating layer include an organic material, and the first insulating pattern and the second insulating pattern include an inorganic material.

21. A display device comprising:
sub state;
a pixel disposed on a surface of the substrate, the pixel comprising a first electrode, an emission layer, and a second electrode;
a buffer layer disposed on the pixel, the buffer layer comprising a first surface facing the pixel and a second surface opposite to the first surface;
a plurality of touch electrodes disposed on the second surface of the buffer layer;
a plurality of first insulating patterns disposed on the second surface of the buffer layer;
a first insulating layer covering the plurality of touch electrodes and the plurality of first insulating patterns; and
a plurality of second insulating patterns disposed on the first insulating layer,
wherein the pixel is disposed between the surface of the buffer layer and the surface of the substrate, wherein the first insulating layer is disposed between the plurality of first insulating patterns and the plurality of second insulating pattern, and wherein each of the plurality of touch electrodes overlaps and contacts one of the plurality of first insulating patterns in a thickness direction perpendicular to the surface of the substrate.

* * * * *